US012663727B2

(12) United States Patent
Nienhuys et al.

(10) Patent No.: US 12,663,727 B2
(45) Date of Patent: Jun. 23, 2026

(54) METHOD FOR CORRECTING MEASUREMENTS IN THE MANUFACTURE OF INTEGRATED CIRCUITS AND ASSOCIATED APPARATUSES

(71) Applicant: ASML Netherlands B.V., Veldhoven (NL)

(72) Inventors: Han-Kwang Nienhuys, Veldhoven (NL); Teis Johan Coenen, Vught (NL); Sander Bas Roobol, Veldhoven (NL); Jeroen Cottaar, Eindhoven (NL); Seyed Iman Mossavat, Waalre (NL); Niels Geypen, Lommel (BE); Sandy Claudia Scholz, Veldhoven (NL); Christina Lynn Porter, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 808 days.

(21) Appl. No.: 17/787,253

(22) PCT Filed: Nov. 27, 2020

(86) PCT No.: PCT/EP2020/083682
§ 371 (c)(1),
(2) Date: Jun. 17, 2022

(87) PCT Pub. No.: WO2021/121906
PCT Pub. Date: Jun. 24, 2021

(65) Prior Publication Data
US 2023/0040124 A1 Feb. 9, 2023

(30) Foreign Application Priority Data

Dec. 18, 2019 (EP) ..................................... 19217327
Jan. 14, 2020 (EP) ..................................... 20151585
(Continued)

(51) Int. Cl.
G03F 7/00 (2006.01)
G03F 9/00 (2006.01)

(52) U.S. Cl.
CPC ........ *G03F 7/70625* (2013.01); *G03F 7/7055* (2013.01); *G03F 9/7088* (2013.01)

(58) Field of Classification Search
None
See application file for complete search history.

(56) References Cited

U.S. PATENT DOCUMENTS 6,952,253 B2    10/2005    Lof et al.
6,961,116 B2    11/2005    Den Boef et al.
(Continued)

FOREIGN PATENT DOCUMENTS

CN          101515105 B        8/2009
CN          102866602 A        1/2013
(Continued)

OTHER PUBLICATIONS

International Search Report and Written Opinion of the International Searching Authority directed to related International Patent Application No. PCT/EP2020/083682, mailed Feb. 26, 2021; 14 pages.
(Continued)

*Primary Examiner* — Miya J Cato
(74) *Attorney, Agent, or Firm* — Finnegan, Henderson, Farabow, Garrett & Dunner, LLP

(57) ABSTRACT

Disclosed is a method of metrology. The method comprises illuminating a radiation onto a substrate; obtaining measurement data relating to at least one measurement of each of one or more structures on the substrate; using a Fourier-related transform to transform the measurement data into a transformed measurement data; and extracting a feature of the
(Continued)

substrate from the transformed measurement data, or eliminating an impact of a nuisance parameter.

22 Claims, 13 Drawing Sheets

(30)            Foreign Application Priority Data

| | | | |
|---|---|---|---|
| Feb. 18, 2020 | (EP) | .................................... | 20157947 |
| May 12, 2020 | (EP) | .................................... | 20174105 |

(56)                    References Cited

U.S. PATENT DOCUMENTS

| | | | |
|---|---|---|---|
| 7,265,364 | B2 | 9/2007 | Teunissen et al. |
| 7,646,471 | B2 | 1/2010 | Teunissen et al. |
| 7,701,577 | B2 | 4/2010 | Straaijer et al. |
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 9,909,983 | B2 | 3/2018 | Pandey |
| 11,594,451 | B2 | 2/2023 | Clark et al. |
| 2005/0003642 | A1* | 1/2005 | Hecht .................... G01B 11/22 |
| | | | 438/526 |
| 2006/0066855 | A1 | 3/2006 | Boef et al. |
| 2007/0224518 | A1 | 9/2007 | Yokhin et al. |
| 2010/0233600 | A1 | 9/2010 | Den Boef et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0229830 | A1* | 9/2011 | Bhattacharyya .... G03F 7/70625 |
| | | | 356/625 |
| 2011/0249244 | A1 | 10/2011 | Leewis et al. |
| 2012/0044470 | A1 | 2/2012 | Smilde et al. |
| 2013/0114081 | A1 | 5/2013 | Fukazawa |
| 2013/0162996 | A1 | 6/2013 | Straaijer et al. |
| 2013/0304424 | A1 | 11/2013 | Bakeman et al. |
| 2014/0019097 | A1 | 1/2014 | Bakeman et al. |
| 2014/0358488 | A1* | 12/2014 | Lee ..................... G03F 7/70616 |
| | | | 702/190 |
| 2015/0261097 | A1 | 9/2015 | Mathijssen et al. |
| 2015/0323316 | A1 | 11/2015 | Shchegrov et al. |
| 2016/0161863 | A1 | 6/2016 | Den Boef et al. |
| 2016/0282282 | A1 | 9/2016 | Quintanilha et al. |
| 2016/0370717 | A1 | 12/2016 | Den Boef et al. |
| 2017/0097575 | A1* | 4/2017 | Pandey .............. G03F 7/70625 |
| 2017/0184981 | A1 | 6/2017 | Quintanilha et al. |
| 2018/0129139 | A1 | 5/2018 | Jiang et al. |
| 2019/0003988 | A1 | 1/2019 | Solarz et al. |
| 2019/0056673 | A1 | 2/2019 | Li et al. |
| 2019/0215940 | A1 | 7/2019 | Khodykin et al. |
| 2019/0318949 | A1* | 10/2019 | Banerjee .............. H01J 37/226 |
| 2022/0155693 | A1* | 5/2022 | Volkovich ........... G03F 7/70683 |
| 2022/0252990 | A1* | 8/2022 | Javaheri ............. G03F 7/70625 |

FOREIGN PATENT DOCUMENTS

| | | | |
|---|---|---|---|
| CN | 105339844 | A | 2/2016 |
| EP | 1 628 164 | A2 | 2/2006 |
| EP | 3 480 554 | A1 | 5/2019 |
| TW | 2016-40091 | A | 11/2016 |
| TW | 201946180 | A | 12/2019 |
| WO | WO 2010/031510 | A1 | 3/2010 |
| WO | WO 2011/012624 | A1 | 2/2011 |
| WO | WO 2016/102127 | A1 | 6/2016 |
| WO | WO 2017/055072 | A1 | 4/2017 |
| WO | WO 2017/186483 | A1 | 11/2017 |
| WO | WO 2019/121486 | A1 | 6/2019 |
| WO | WO 2019/206586 | A1 | 10/2019 |

OTHER PUBLICATIONS

International Preliminary Report on Patentability directed to related International Patent Application No. PCT/EP2020/083682, issued May 17, 2022; 11 pages.

Lemaillet et al., "Intercomparison between optical and x-ray scatterometry measurements of FinFET structures," Proc. of SPIE, vol. 8681, Metrology, Inspection, and Process Control for Microlithography XXVII, Apr. 2013; 8 pages.

* cited by examiner

FIG.16A                    FIG.16B

FIG. 17A
FIG. 17B
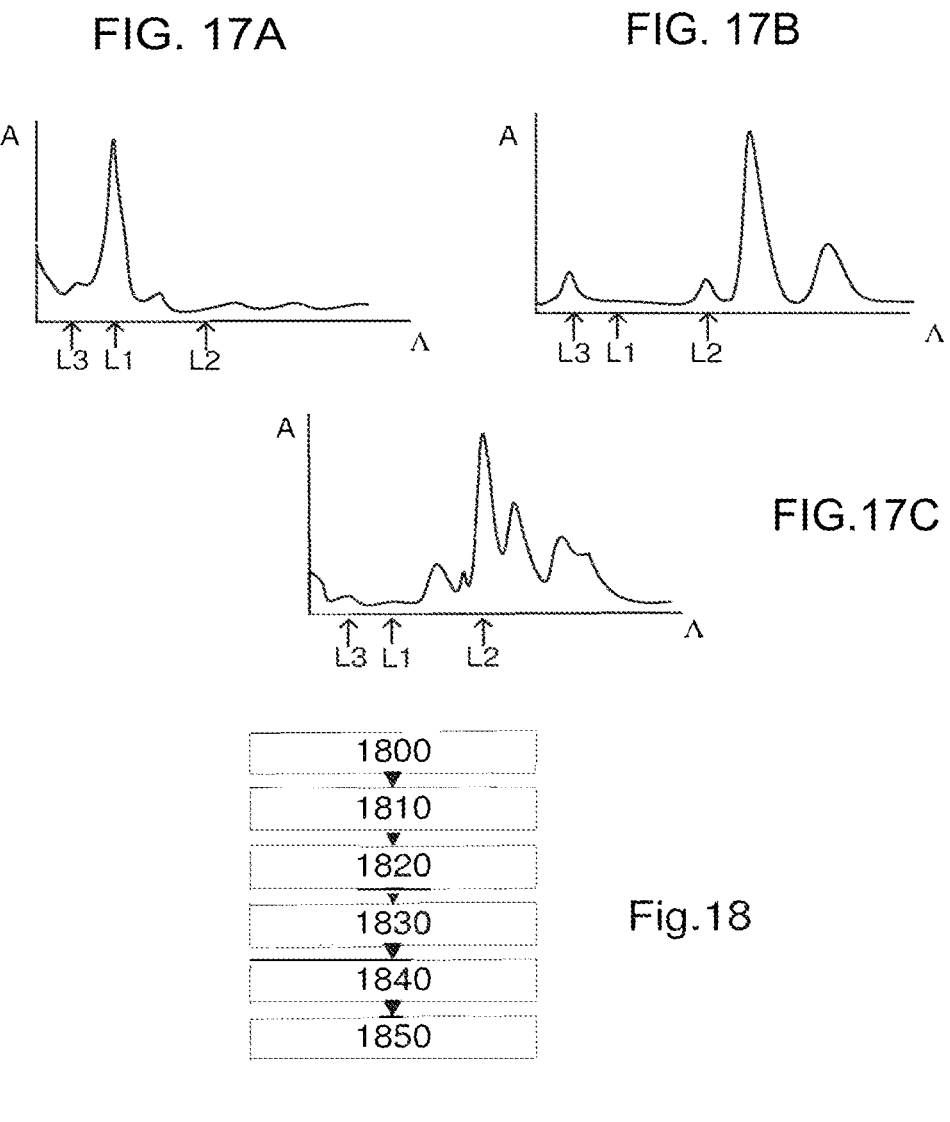
FIG.17C
Fig.18
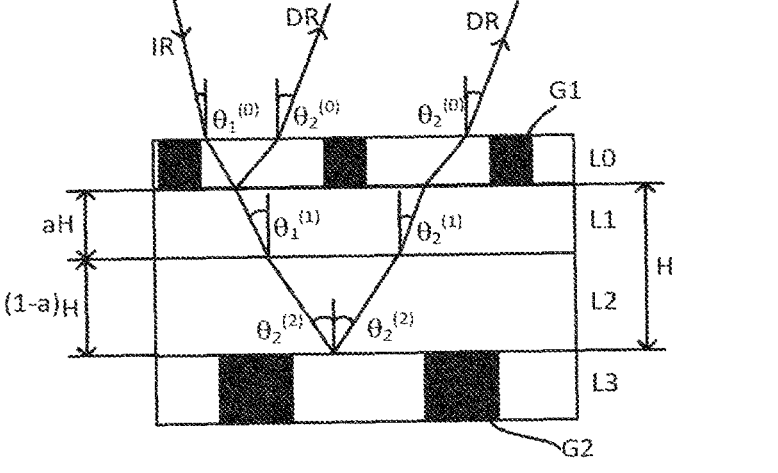
Fig.19

| | |
|---|---|
| - - - - - - - - - - | OVL=2nm, H=95.0 |
| ———————— | OVL=5nm, H=95.0 |
| ‑‑‑‑‑‑‑‑‑‑ | OVL=2nm, H=96.0 |
| ‑‑‑‑‑‑‑‑‑‑ | OVL=5nm, H=96.0 |

METHOD FOR CORRECTING MEASUREMENTS IN THE MANUFACTURE OF INTEGRATED CIRCUITS AND ASSOCIATED APPARATUSES

CROSS-REFERENCE TO RELATED APPLICATIONS

This application claims priority of EP application 19217327.6 which was filed on Dec. 18, 2019 and EP application 20151585.5 which was filed on Jan. 14, 2020 and EP application 20157947.1 which was filed on Feb. 18, 2020 and EP application 20174105.5 which was filed on May 12, 2020 and which are incorporated herein in their entirety by reference.

FIELD

The present invention relates to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-IR wave range, which requires the pitch of the grating to be much coarser than the actual product structures whose properties are actually of interest. Such product features may be defined using deep ultraviolet (DUV), extreme ultraviolet (EUV) or X-ray radiation having far shorter wavelengths. Unfortunately, such wavelengths are not normally available or usable for metrology.

On the other hand, the dimensions of modern product structures are so small that they cannot be imaged by optical metrology techniques Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

By decreasing the wavelength of the radiation used during metrology (i.e. moving towards the "soft X-ray (SXR)" wavelength spectrum), it is possible to resolve smaller structures, to increase sensitivity to structural variations of the structures and/or penetrate further into the product structures. One such method of generating suitably high frequency radiation (e.g., soft X-ray and/or EUV radiation) may be using a pump radiation (e.g., infra-red radiation) to excite a generating medium, thereby generating an emitted radiation, optionally a high harmonic generation comprising high frequency radiation.

It is desirable to eliminate or mitigate the signal impact due to drift parameter variation, i.e., parameters which are subject to drift from assumed, nominal and/or designed values. Such drift parameters may comprise, for example, detector position, illumination polar angles (incident angle and azimuth angle) and layer thickness of one or more substrate layers.

SUMMARY

In a first aspect of the invention there is provided a method of metrology comprising: obtaining measurement data relating to at least one measurement of each of one or more structures on a substrate; the measurement data being dependent upon one or more drift parameters, said drift parameters comprising at least one interdependent drift parameter for which each measurement is dependent on a structure response metric which varies with an illumination setting and said at least one interdependent drift parameter interdependently; and correcting the measurement data based on an approximately invariant transformation of said structure response metric or related metric.

In a second aspect of the invention there is provided a method of inferring a value for a parameter of interest from said measurement data, comprising: obtaining said measurement data, said measurement data relating to scattered radiation from a target captured on a detector; obtaining a trained forward model describing a measured signal in terms of at least one parameter of interest term describing the periodic response to the parameter of interest of a target, one or more nuisance terms describing other variations between measurements of the target and a constant term representing a constant component of the measurement data; and inferring the value for the parameter of interest from said measurement data using said trained forward model.

Also disclosed is a computer program, metrology apparatus and a lithographic apparatus being operable to perform the method of the first or second aspects.

The above and other aspects of the invention will be understood from a consideration of the examples described below.

BRIEF DESCRIPTION OF THE DRAWINGS

Embodiments will now be described, by way of example only, with reference to the accompanying schematic drawings, in which:

FIG. 14B estimated layer thickness as a function of time;

FIGS. 16A-16B show two configurations of gratings acting as effective point scatterers; FIG. 16A a first target comprising gratings in two layers, and FIG. 16B a single, tilted grating;

FIGS. 17A-17C show plots of distance spectra in distance space for FIG. 17A top asymmetry, FIG. 17B bottom asymmetry and FIGS. 17C overlay;

FIG. 18 is a flowchart describing a first method of overlay inference according to an embodiment of the invention;

FIG. 19 is a schematic drawing of an overlay target illustrating the effect of the different refractive indices of different layers and surrounding vacuum on diffraction from the target;

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figures 1, 2:
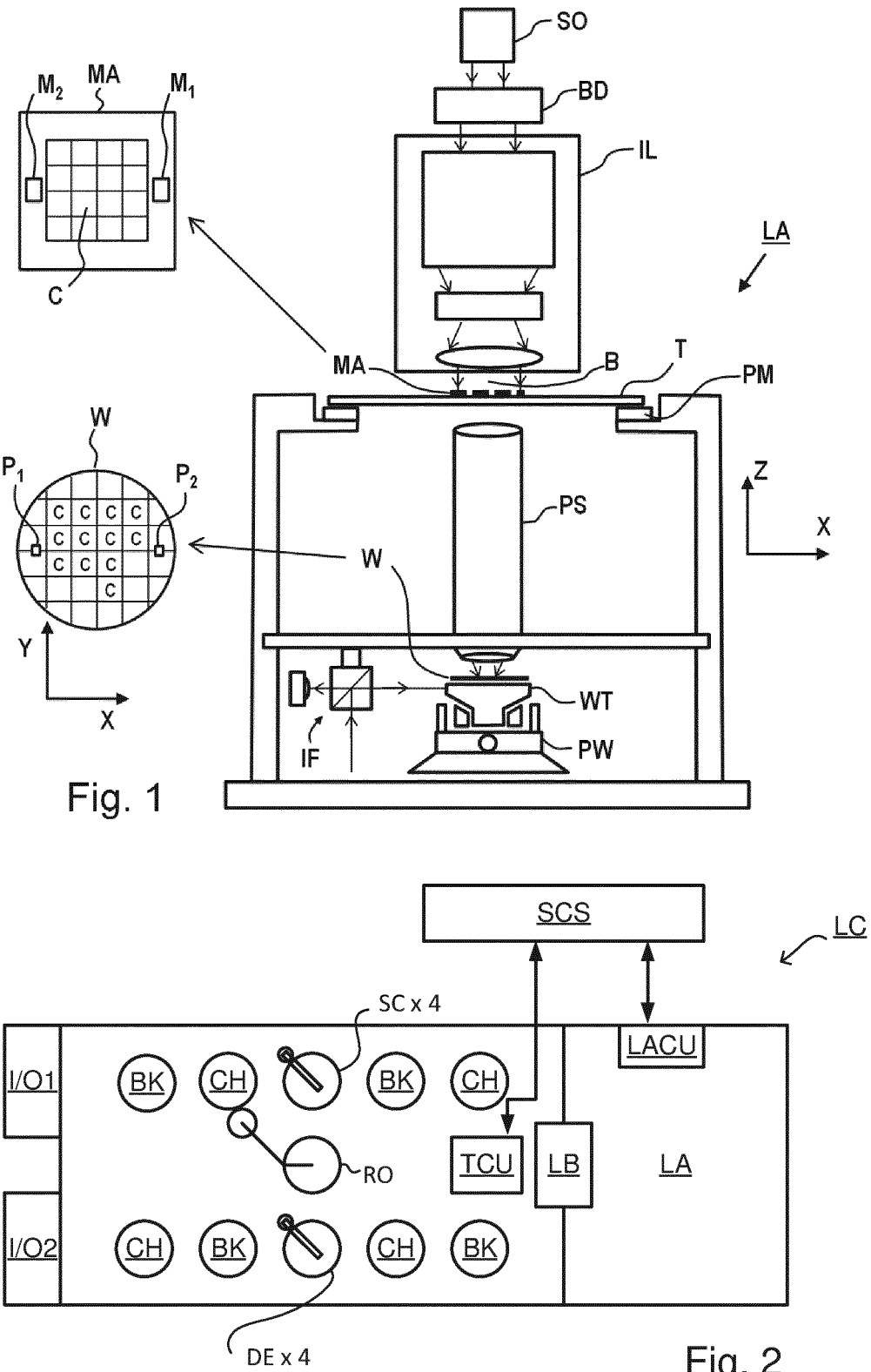
FIG. 1 depicts a schematic overview of a lithographic apparatus.
FIG. 2 depicts a schematic overview of a lithographic cell.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT may be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, may be under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement may be called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from hard X-ray, soft X-ray, extreme ultraviolet and visible to near-IR wavelength range. In case that the radiation is hard X-ray or soft X-ray, optionally with a wavelength ranging from 0.01 to 10 nm, the aforementioned scatterometers may optionally be a small-angle X-ray scattering metrology tool.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), shape of structures, etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected, transmitted or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered or transmitted radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920, 968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (maybe overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. The pitch and line-width of the structures in the gratings may strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figures 3, 4:
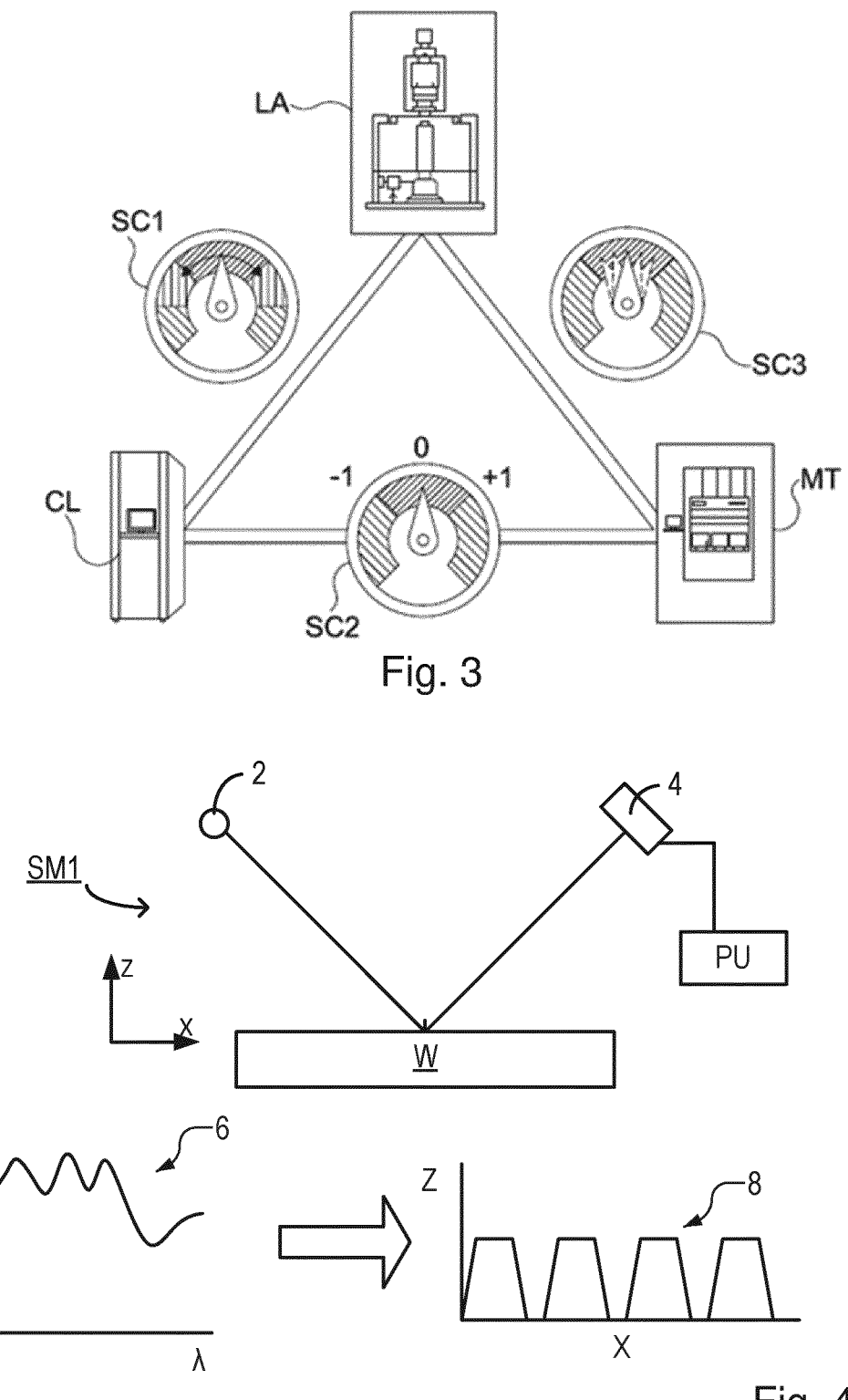
FIG. 3 depicts a schematic representation of holistic lithography, representing a cooperation between three key technologies to optimize semiconductor manufacturing.
FIG. 4 schematically illustrates a scatterometry apparatus.

The patterning process in a lithographic apparatus LA may be one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—maybe within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). The resolution enhancement techniques may be arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating may be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure in one image multiple targets from multiple gratings using light from hard X-ray, soft X-ray, extreme ultraviolet and visible to near-IR wave range.

One example of a metrology apparatus, such as a scatterometer, is depicted in FIG. 4. It may comprise a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

As an alternative to optical metrology methods, it has also been considered to use hard X-ray, soft X-rays or EUV radiation, for example radiation in a wavelength range between 0.01 nm and 100 nm, or optionally between 0.01 nm and 50 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. It is noted that the use of laser produced plasma (LPP) x-ray source is described in U.S. Patent Publication No. 2019/003988A1, and in U.S. Patent Publication No. 2019/215940A1, which are incorporated herein by reference in the entirety. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques may be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

In a transmissive version of the example of a metrology apparatus, such as a scatterometer, the transmitted radiation is passed to a spectrometer detector, which measures a spectrum as discussed above. Such a scatterometer may be configured as a normal-incidence scatterometer or an oblique-incidence scatterometer. Optionally, the transmissive version using hard X-ray radiation with wavelength <1 nm, optionally <0.01 nm.

It is possible that the range of application makes the use of wavelengths in e.g. the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The contents of the cited US patent application are incorporated herein by reference in their entirety.

Figure 5:
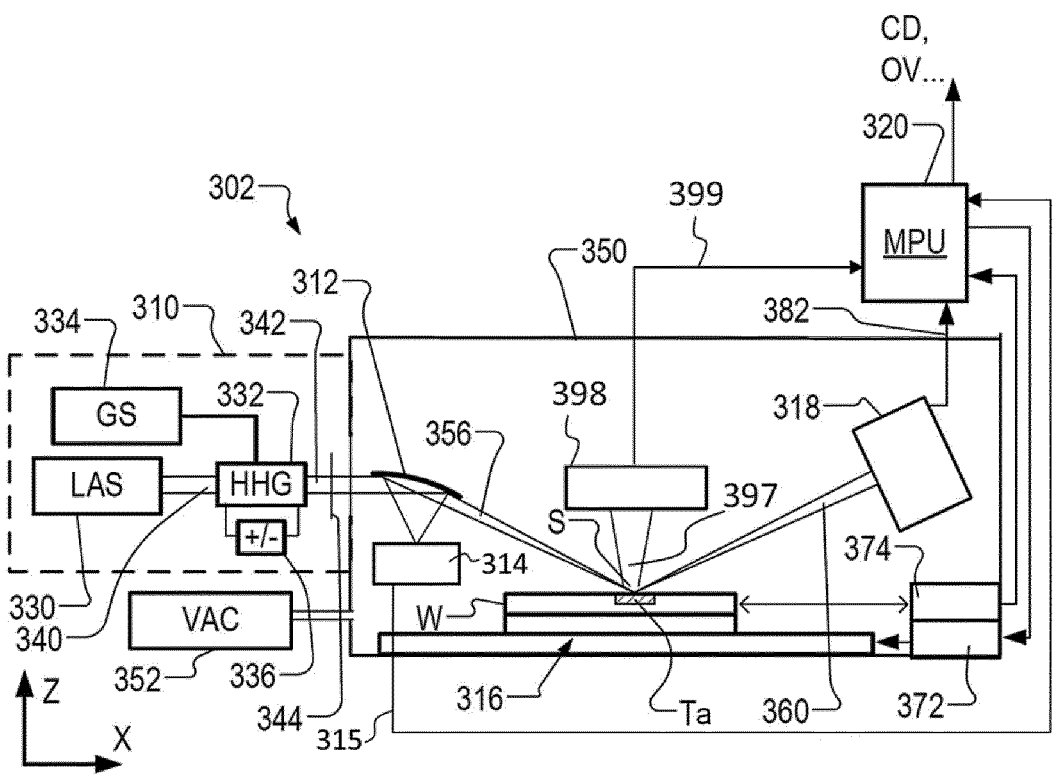
FIG. 5 depicts a schematic representation of a metrology apparatus in which EUV and/or SXR radiation is used.

FIG. 5 depicts a schematic representation of a metrology apparatus 302 in which radiation in the wavelength range from 0.1 nm to 100 nm may be used to measure parameters of structures on a substrate. The metrology apparatus 302 presented in FIG. 5 is suitable for the soft X-rays or EUV domain.

FIG. 5 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source or called illumination source 310, illumination system 312, substrate support 316, detection systems 318, 398 and metrology processing unit (MPU) 320.

An illumination source 310 in this example is for a generation of EUV or soft x-ray radiation, which may be based on high harmonic generation (HHG) techniques. Main components of the radiation source are a pump radiation source 330 operable to emit the pump radiation and a gas delivery system 332. Optionally the pump radiation source 330 is a laser, optionally the pump radiation source 330 is a pulsed high-power infrared or optical laser. The pump radiation source 330 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). Optionally, the laser pulses are delivered as a first pump radiation 340 to the gas delivery system 332, where in the gas a portion of the radiation is converted to higher frequencies than the first radiation into an emitted radiation 342. A gas supply 334 supplies a suitable gas to the gas delivery system 332, where it is optionally ionized by an electric source 336. The gas delivery system 332 may be a cut tube.

The emitted radiation may contain multiple wavelengths. If the emitted radiation were monochromatic, then measurement calculations (for example reconstruction) may be simplified, but it is easier to produce radiation with several wavelengths. An emission divergence angle of the emitted radiation may be wavelength dependent. A gas provided by the gas delivery system 332 defines a gas target, which may be a gas flow or a static volume. The gas may be for example a noble gas such as neon (Ne), helium (He) or argon (Ar). N2, O2, Ar, Kr, Xe gases may all be considered. These may be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific harmonic wavelengths from among those generated. Some or all of the beam path may be contained within a vacuum environment, bearing in mind that SXR radiation is absorbed when traveling in air. The various components of radiation source 310 and illumination optics 312 may be adjustable to implement different metrology 'recipes' within the same apparatus. For example different wavelengths and/or polarization may be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm may suffer from very low critical angle when reflecting off materials of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained near vacuum by vacuum pump 352, so that EUV radiation may pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 μm in diameter, when projected onto the structure of interest. Substrate support 316 comprises for example an X-Y translation stage and a rotation stage, by which any part of the substrate W may be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 5, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 5 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 may also communicate with a position controller 372 which operates the translation stage, rotation and/or tilting stages. Processor 320 receives highly accurate feedback on the position and orientation of the substrate, via sensors. Sensors 374 may include interferometers, for example, which may give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured may include overlay (OVL), critical dimension (CD), focus of the lithography apparatus while the lithography apparatus printed the target structure, coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 may be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV and/or Soft X-Ray (SXR) radiation, to perform measurements. In order to perform metrology at a particular wavelength or wavelength range, the metrology tool MT requires access to a source providing radiation at that/those wavelength(s). Different types of sources exist for providing different wavelengths of radiation. Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) to obtain radiation at the desired wavelength(s). One of the challenges faced in the development of these sources is how to couple the emitted radiation out of the generating setup efficiently and separate the emitted radiation from the radiation used to drive the process.

Figure 6:
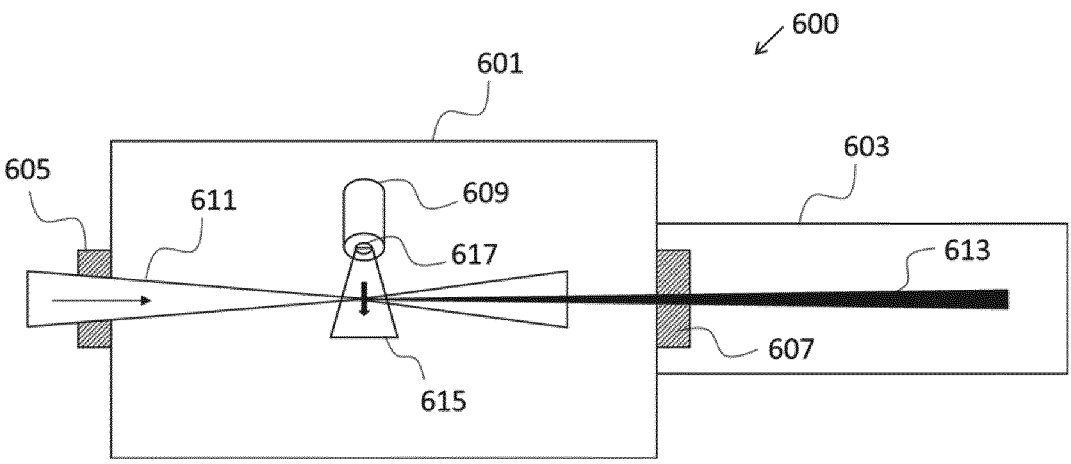
FIG. 6 depicts a simplified schematic drawing of an illumination source, which may be the illumination source for high harmonic generation for a metrology apparatus such as that illustrated in FIG. 5.

FIG. 6 shows a simplified schematic drawing of an embodiment 600 of an illumination source 310, which may be the illumination source for high harmonic generation. One or more of the features of the illumination source in the metrology tool described with respect to FIG. 5 may also be present in the illumination source 600 as appropriate. The illumination source 600 comprises a chamber 601. The illumination source 600 is configured to receive a pump radiation 611 with a propagation direction which is indicated by an arrow. The pump radiation 611 shown here is an example of the pump radiation 340 from the pump radiation source 330, as shown in FIG. 5. The pump radiation 611 may be directed into the chamber 601 through the radiation input 605, which maybe a viewport which may be made of fused silica or a comparable material. The pump radiation 611 may have a Gaussian or hollow, for example annular, transversal cross-sectional profile and may be incident, optionally focused, on a gas flow 615, which has a flow direction indicated by a second arrow, within the chamber 601. The gas flow 615 comprises a small volume (for example several cubic mm) of a particular gas (e.g., a noble gas, optionally Helium, Argon, or Neon, nitrogen, oxygen or carbon dioxide) in which the gas pressure is above a certain value. The gas flow 615 may be a steady flow. Other media, such as metallic plasmas (e.g. aluminium plasma) may also be used.

The gas delivery system of the illumination source 600 is configured to provide the gas flow 615. The illumination source 600 is configured to provide the pump radiation 611 in the gas flow 615 to drive the generation of emitted radiation 613. The region where at least a majority of the emitted radiation 613 is generated is called an interaction region. The interaction region may vary from several tens of micrometers (for tightly focused pump radiation) to several mm or cm (for moderately focused pump radiation) or even up to a few meters (for extremely loosely focused pump radiation). Optionally, the gas flow 615 is provided by the gas delivery system into an evacuated or nearly evacuated space. The gas delivery system comprises a gas nozzle 609, as shown in FIG. 6, which comprises an opening 617 in an exit plane of the gas nozzle 609. The gas flow 615 is provided from the opening 617. In almost all the prior arts, the gas nozzle has a cut tube geometry shape which is a uniform cylinder interior geometry shape, and the shape of the opening in the exit plane is round. An elongated opening has also been used as described in the patent application CN101515105B.

The dimensions of the gas nozzle 609 may conceivably also be used in scaled-up or scaled-down versions ranging from micrometer-sized nozzles to meter-sized nozzles. This wide range of dimensioning comes from the fact that the setup may be scaled such that the intensity of the pump radiation at the gas flow ends up in the particular range which may be beneficial for the emitted radiation, which requires different dimensioning for different pump radiation energies, which may be a pulse laser and pulse energies can vary from tens of microjoules to joules.

Due to interaction of the pump radiation 611 with the gas atoms of the gas flow 615, the gas flow 615 will convert part of the pump radiation 611 into the emitted radiation 613, which may be an example of the emitted radiation 342 shown in FIG. 5. The central axes of the emitted radiation 613 may be collinear with the central axes of the incident pump radiation 611. The emitted radiation 613 may have a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

In operation the emitted radiation 613 beam may pass through a radiation output 607 and may be subsequently manipulated and directed by an illumination system 603, which may be an example of the illumination system 312 in FIG. 5, to a wafer to be inspected for metrology measurements. The emitted radiation 613 may be guided, optionally focused, to a target on the wafer.

Because air (and in fact any gas) heavily absorbs SXR or EUV radiation, the volume between the gas flow 615 and the wafer to be inspected may be evacuated or nearly evacuated.

Since the central axes of the emitted radiation 613 may be collinear with the central axes of the incident pump radiation 611, the pump radiation 611 may need to be blocked to prevent it passing through the radiation output 607 and entering the illumination system 603. This may be done by incorporating a filtering device 344 shown in FIG. 5 into the radiation output 607, which is placed in the emitted beam path and that is opaque or nearly opaque to the driving radiation (e.g. opaque or nearly opaque to infrared or visible light) but at least partially transparent to the emitted radiation beam. The filter may be manufactured using zirconium. The filter may be a hollow, optionally an annular, block when the pump radiation 611 has a hollow, optionally an annular, transversal cross-sectional profile.

Described herein are methods, apparatuses, and assemblies to obtain emitted radiation optionally at a high harmonic frequency of pump radiation. The radiation generated through the process, optionally the HHG which uses non-linear effects to generate radiation at a harmonic frequency of provided pump radiation, may be provided as radiation in metrology tools MT for inspection and/or measurement of substrates. The substrates may be lithographically patterned substrates. The radiation obtained through the process may also be provided in a lithographic apparatus LA, and/or a lithographic cell LC. The pump radiation may be pulsed radiation, which may provide high peak intensities for short bursts of time.

The pump radiation 611 may comprise radiation with one or more wavelengths higher than the one or more wavelengths of the emitted radiation. The pump radiation may comprise infrared radiation. The pump radiation may comprise radiation with wavelength(s) in the range of 800 nm to 1500 nm. The pump radiation may comprise radiation with wavelength(s) in the range of 900 nm to 1300 nm. The pump radiation may comprise radiation with wavelength(s) in the range of 100 nm to 1300 nm. The pump radiation may be pulsed radiation. Pulsed pump radiation may comprise pulses with a duration in the femtosecond range.

For some embodiments, the emitted radiation, optionally the high harmonic radiation, may comprise one or more harmonics of the pump radiation wavelength(s). The emitted radiation may comprise wavelengths in the extreme ultra-violet (EUV), soft X-Ray (SXR), and/or hard X-Ray (HXR) part of the electromagnetic spectrum. The emitted radiation 613 may comprise wavelengths in the range of 0.01 nm to 100 nm. The emitted radiation 613 may comprise wavelengths in the range of 0.1 nm to 100 nm. The emitted radiation 613 may comprise wavelengths in the range of 0.1 nm to 50 nm. The emitted radiation 613 may comprise wavelengths in the range of 1 nm to 50 nm. The emitted radiation 613 may comprise wavelengths in the range of 10 nm to 20 nm.

Figures 7A, 7B, 7C, 7D:
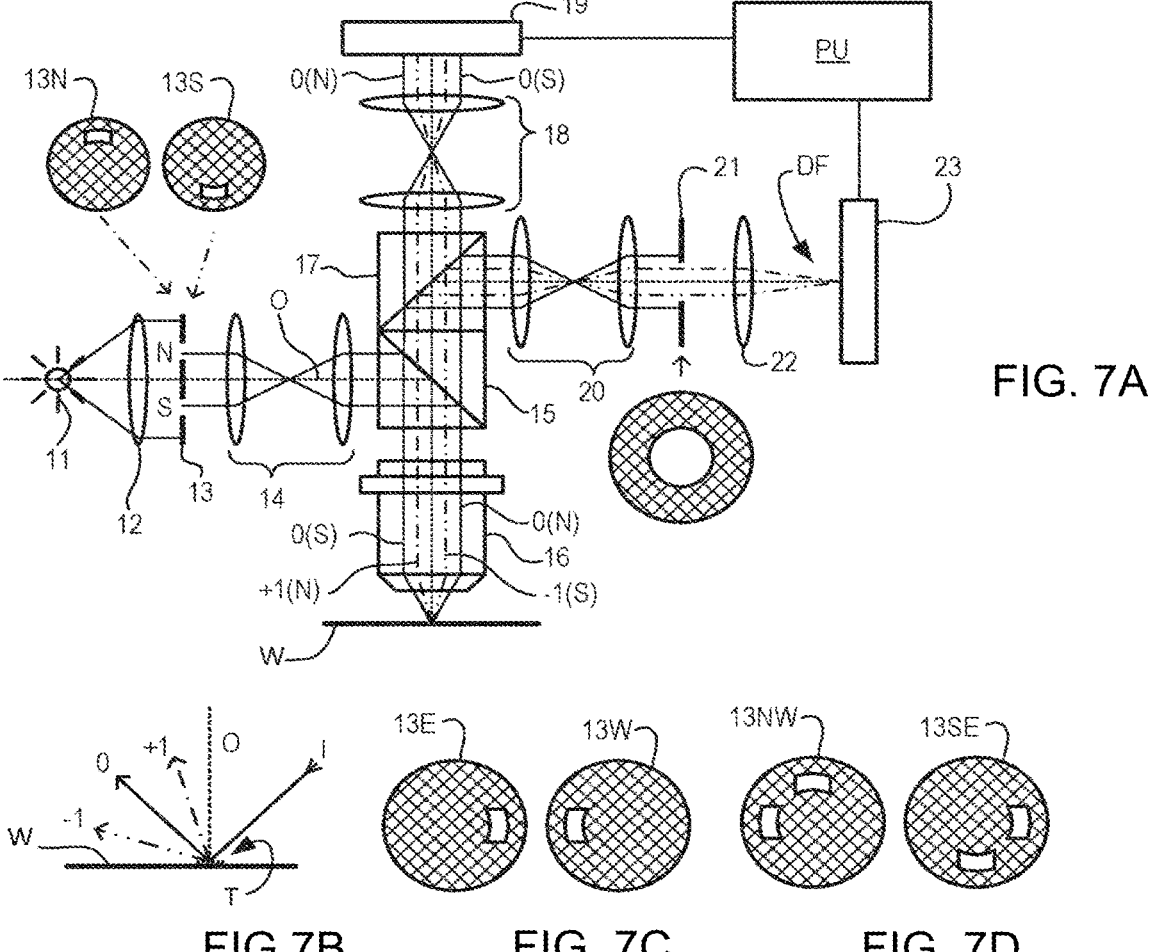
FIGS. 7A-7D comprise FIG. 7A a schematic diagram of a dark field scatterometer for use in measuring targets according to embodiments of the invention using a first pair of illumination apertures, FIG. 7B a detail of diffraction spectrum of a target grating for a given direction of illumination FIG. 7C a second pair of illumination apertures providing further illumination modes in using the scatterometer for diffraction based overlay measurements and FIG. 7D a third pair of illumination apertures combining the first and second pair of apertures.

A further metrology apparatus suitable for use in embodiments of the invention is shown in FIG. 7(*a*). Note that this is only one example of a suitable metrology apparatus. An alternative suitable metrology apparatus may use EUV radiation such as, for example, that disclosed in WO2017/186483A1. A target structure T and diffracted rays of measurement radiation used to illuminate the target structure are illustrated in more detail in FIG. 7(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line 0. In this apparatus, light emitted by source 11

(e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 7(*b*), target structure T is placed with substrate W normal to the optical axis O of objective lens 16. The substrate W may be supported by a support (not shown). A ray of measurement radiation I (e.g., comprising SXR wavelengths) impinging on target structure T from an angle off the axis O gives rise to a zeroth order ray (solid line 0) and two first order rays (dot-chain line +1 and double dot-chain line −1). It should be remembered that with an overfilled small target structure, these rays are just one of many parallel rays covering the area of the substrate including metrology target structure T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 7(*a*) and 7(*b*) are shown somewhat off axis, purely to enable them to be more easily distinguished in the diagram.

At least the 0 and +1 orders diffracted by the target structure T on substrate W are collected by objective lens 16 and directed back through beam splitter 15. Returning to FIG. 7(*a*), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target structure on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 7(*c*) and (*d*). The use of these, and numerous other variations and applications of the apparatus are described in prior published applications, mentioned above.

Another type of metrology tool used in IC manufacture is a topography measurement system, level sensor or height sensor. Such a tool may be integrated in the lithographic apparatus, for measuring a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 8:
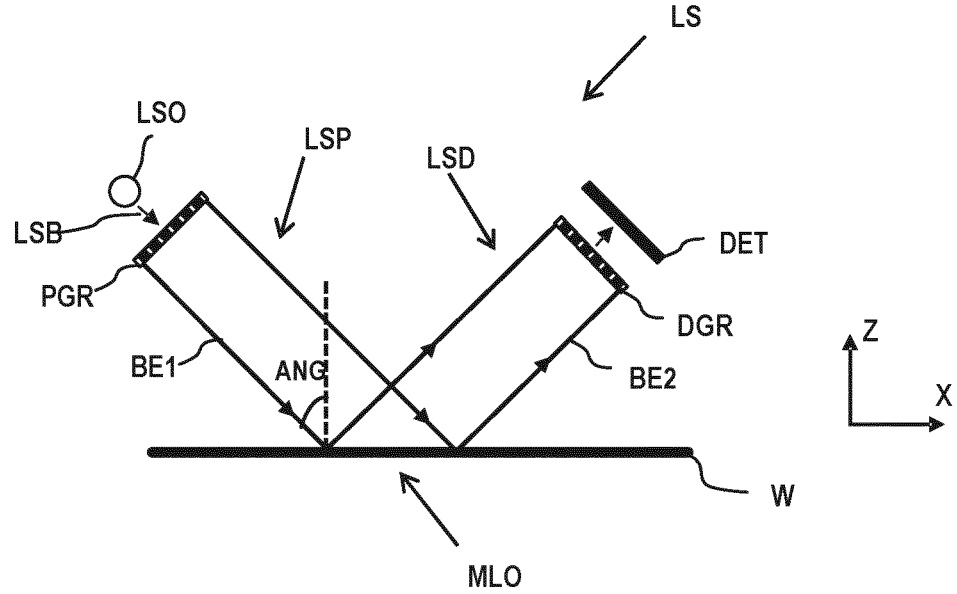
FIG. 8 depicts a schematic overview of a level sensor apparatus which may use methods according to embodiments of the invention.

An example of a level or height sensor LS as known in the art is schematically shown in FIG. 8, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband light source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass SXR wavelengths, UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

Another type of metrology tool used in IC manufacture is an alignment sensor. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks or targets. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

Figure 9:
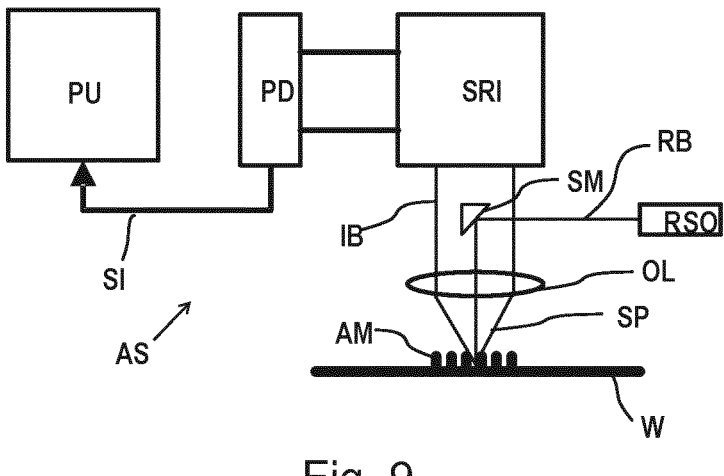
FIG. 9 depicts a schematic overview of an alignment sensor apparatus which may use methods according to embodiments of the invention.

FIG. 9 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths (e.g., comprising SXR wavelengths), which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the alignment mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Different coordinate systems are mentioned in the following context. A "dual space", which is a pair of (real space, reciprocal space), is defined, and there may be no phase in reciprocal space data. The transformation between the two has scaling properties. For example, two times smaller in one space coordinate is equal to two times larger in the other space coordinate. Data represented in one space can be transformed into the other, and vice versa, using a Fourier-related transform, which we define broadly to include transforms such as the Fourier transform, the Laplace transform, and a wavelet transform.

Three of the coordinate systems mentioned in the following texts are (1) diffraction angle coordinate system, which may also be described as pupil space or detector pixel coordinate system, which is a reciprocal space; (2) wavenumber or wavevector space, which may be described as inverse space, which is also a reciprocal space; (3) real space, may also mentioned as target coordinate system. One of the methods to transform measurement data into real space is Fourier transform. More specifically, the following spaces are discussed:

Pupil space: as a function of diffraction angle, polar coordinates of the diffracted radiation, dimensionless pupil coordinate (the components $(\kappa_x, \kappa_y)$ of the unit vector along the diffracted radiation), or the $(x, y)$ coordinates of the pixel on the image sensor. Conversion between related pupil-space representations is straightforward.

Reciprocal space: as a function of wavenumber ($\tilde{v}=1/\lambda$) or wavevector $\tilde{v}$ (wavenumber with a direction vector; sometimes with a factor $2\pi$). Also referred to as "inverse space". Note that the "pupil space" may also be considered to be a type of reciprocal space.

Real space: as a function of X, Y, Z coordinates within (the unit cell of) the target. A representation in real space can be obtained by Fourier-transforming a signal in reciprocal space. If the complex phase in real reciprocal space is not available, the representation in real space is an autocorrelation function of a property of the target.

To prevent confusion, the spaces may also be referred to by the symbol names, e.g. (X, Z) space for real space, and for example $\tilde{v}$-space or q-space for reciprocal space.

In SXR or HXR metrology, a target (or more generally a structure e.g., a periodic pattern on a wafer) is illuminated with a soft X-ray beam (which may have, for example, a divergence 2 mrad, and bandwidth 9 nm-20 nm) or a hard X-ray beam. The diffraction pattern is captured by one or more image sensors; for example, in some arrangements there may be three separate sensors, respectively for the positive diffraction orders, the zeroth (specular) order and the negative diffraction orders. Each wavelength component in the SXR or HXR beam may create diffraction spots in a different location on a respective sensor.

The diffraction pattern (intensity as a function of position on the detector) is the combined effect of three categories of parameters:

1) Target parameters; these include (a) parameters of interest such as overlay (OVL) and critical dimension (CD)—the target is designed for measuring and monitoring of these parameters; and (b) nuisance parameters which affect the measurement but are not necessarily of interest. Examples include the refractive index of the material (e.g., $SiO_2$); sidewall angle of a buried structure created in an earlier etching step and (in some situations), the thickness h of a layer or combination of layers at or near the top of the stack.

2) Properties of the incident SXR beam: e.g., power, spectrum, divergence, and polarization;

3) The metrology-tool alignment: angle of incidence $\theta$ and azimuthal angle $\varphi$ of the incident beam relative to the wafer and detector position and orientation (e.g., in 6 degrees of freedom DoF) relative to the target (point where the chief ray of the incident beam is incident on the wafer). In total, there may be 8 DoF in tool alignment. Note that a position or orientation error of the target itself will also contribute to these 8 DoF. It is assumed, where there are multiple image sensors, they do not move relative to each other; otherwise there would be additional degrees of freedom.

In a SXR metrology tool, the goal is to estimate target parameters of interest from a measured diffraction pattern (category 1(a)). It is generally necessary or at least desirable to eliminate or mitigate the signal impact due to drift parameter variation, i.e., parameters in category 1(b), 2 and 3 which are subject to drift from expected, assumed, nominal and/or designed values (where drift can be defined as the difference between an actual value of a parameter and its expected, assumed, nominal and/or designed value). One approach is to design a metrology tool with sufficient stability and reproducibility that the variation (from minute to minute or month to month) for some of these parameters is negligible. Such an approach is not feasible in practice; the stability requirements would be very expensive to meet and such an approach will not help with those drift parameters in category 1(b) in any case. Another approach is to measure the tool parameters and take them into account in the analysis. This may be feasible for the beam parameters (category 2), since most beam properties will be measured simultaneously with the measurements on targets. However, monitoring of the other drift parameters is either not possible or impractical in terms of the constraints imposed by a high-volume IC manufacturing processes.

It is desirable to provide a method which can eliminate or mitigate the influence of one or more such drift parameter errors from a measurement on a target, without prior knowledge on how the specific target responds to changes in the alignment parameters.

Tool-Alignment Correction

In particular, it is desirable to provide a method which can eliminate or mitigate the influence of "entangled" or interdependent drift parameters, e.g., drift parameters for which the target response and tool alignment are interdependent; e.g., there is crosstalk between these parameters. Examples of two such interdependent drift parameters include angle of incidence θ and wafer/stack thickness h. For example, the consequence of variation in the angle of incidence θ is not only a shift of the diffraction pattern on the detector, but also a change in a target response metric (or structure response metric) such as the target diffraction coefficient(s); e.g., the fraction of incident power that is diffracted to a given diffraction order, for a given wavelength and/or polarization. To illustrate this by way of a specific numerical example: the 14.00 nm wavelength component of the incident beam for a particular target may be diffracted into the first order for θ=35.00 deg but not diffracted at θ=35.01 deg or vice versa.

An embodiment comprises performing data processing steps on a set of measurements relating to the same type of target. Differences between these measurements may result from a number of aspects including, for example: tool drift, tool-to-tool variations, and small difference in target parameters (e.g., OVL, CD). These measurements may be described by a 3D array I[i, j, k], where i refers to an individual measurement in the set and j and k refer to detector pixel rows and columns, respectively. These measurements may optionally have undergone minor pre-processing, such as for noise removal.

Figure 10:
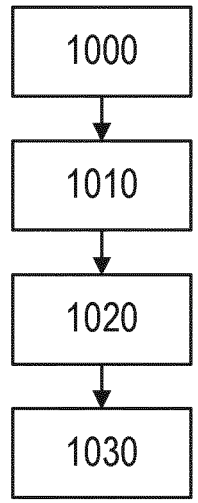
FIG. 10 is a flowchart describing a method according to embodiments of the invention.

FIG. 10 is a flowchart describing such a method according to an embodiment. Not that the following paragraphs describe only one possible embodiment. It describes one example of a specific implementation which takes advantage of the interdependence between specific drift parameters (e.g., angle of incidence θ, stack thickness h and wavelength λ). Furthermore the mathematical details are described only for one particular example geometrical layout, for illustration.

At step 1000 a difference ΔI[i, j, k] between each measurement image I[i, j, k] and a reference image $I_0$[j, k] is calculated; e.g., ΔI[i, j, k]=I[i, j, k]−$I_0$[j, k]. The reference image $I_0$[j, k] may be a single image, and may comprise an average of the measurement set I[i, j, k] or DC signal. As such, the DC signal $I_0$[j, k] describes a non-varying component of the measurement images I[i, j, k] and the difference intensity measurements ΔI[i, j, k] describes a varying component of the measurement images I[i, j, k].

At step 1010, partial derivatives J[i, j, k, m] related to drift parameters are estimated for each dataset (each value of i). Here, m refers to the drift parameter number. For example, m can be in the range 1 to 9 to cover the 8 DoF of tool alignment and additionally a wafer parameter such as stack thickness. It could also include other tool parameters such as (e.g., SXR) illumination source power and/or beam divergence. The partial derivatives describe, for each drift parameter, how the measurement images (intensity distributions) change with drift in the drift parameters.

At step 1020, coefficients c[i, m] are determined from a minimization of a suitable cost function (e.g., least-squares). A specific example may comprise e.g.,:

$$\Delta \hat{I}[i, j, k] = \Delta I[i, j, k] - \sum_m c[i, m] J[i, j, k, m] \qquad (1)$$

In this manner, one or more components of the difference intensity measurements ΔI[i, j, k] attributable to drift in one or more of the drift parameters is subtracted from the intensity measurements ΔI[i, j, k] to obtain corrected measurements or drift-independent varying images Δ$\hat{I}$[i, j, k]. As such, the drift-independent varying images are minimized in terms of the difference between the difference signals images and a linear combination of the partial derivatives. The least-squares minimization may optionally account for estimated noise levels in the pixels. Other figures of merit than 'sum of squared deviations' may also be used to find the coefficients. For example, Bayesian analysis, which accounts for a known or estimated probability distribution of the coefficients c, or a method which can handle non-Gaussian noise in the signal may be used.

In an alternative embodiment, rather than first pre-processing the data by removing a signal contribution attributable to the drift parameters and then interpreting the pre-processed data to infer information about parameters of interest, a parameter of interest may be fitted together with the drift parameters.

At step 1030, the drift independent varying images Δ$\hat{I}$ may be used as the corrected measurement signals from which a parameter of interest (e.g., overlay, CD, focus) may be determined. Alternatively, or in addition the drift independent varying images Δ$\hat{I}$ may be used in further analysis. For example, it may be used for error correction (i.e. elimination of impact of nuisance parameters on lithographic processing parameters, for example overlay); for example, the set of original signals could comprise a number of reference measurements from targets with known overlay and from a set of targets with unknown overlay.

The data above is described in terms of rows and columns of pixels comprised within an image sensor signal; however, it can optionally be described in terms of a combined signal from multiple image sensors, or else a signal which is mapped into pupil space ($κ_x$, $κ_y$) (see below).

More detail of how step 1010 may be performed will now be described. This describes estimating partial derivatives J[i, j, k, m] to tool alignment/wafer drift parameters without information other than measurements I[i, j, k] and an approximate estimate of the drift parameters; e.g., the nominal (designed) values of those tool parameters and/or wafer parameters. The method describes, in particular, methods for estimating these partial derivatives for the interdependent drift parameters for which the target response varies with illumination setting (e.g., where illumination setting may describe one or both of a wavelength and/or polarization of the illumination radiation) and the drift parameter(s) interdependently. In the treatment below, the index i will be dropped from the equations.

Estimating partial derivatives for two specific such interdependent parameters will be explicitly described, namely angle of incidence θ of the illumination beam on the substrate and the layer or stack thickness h. While these are both nominally set to a value (e.g., angle of incidence θ may be set to any nominal value between 10°-70°, a set value for thickness h will vary per application), control of these parameters cannot be perfect and as such there may be some deviation in the actual values around the set or expected values. The fact that a target response metric (e.g., such as the target reflectance as a function of wavelength and diffraction-order number) and therefore the measured intensity distributions is dependent on each of these parameters interdependently with wavelength means that determining the partial derivatives for these interdependent parameters is not straightforward. In addition, methods for determining partial derivatives for other tool alignment parameters will be described; these include the other illumination polar angle, azimuth angle φ, and detector position and orientation (6 DoF).

In the description below, the mapping, from a signal represented as a detector image I[j, k] to the same signal represented in pupil space, Î(κ) will be available, parametrized by one or more tool alignment/wafer parameters; e.g., up to 9 DoF (8 tool alignment DoFs and stack thickness h) with parameters $(p_1, \ldots, p_9)$. The parameter κ represents the $(\kappa_x, \kappa_y)$ vector in pupil space, i.e., the x and y components of the direction unit vector $(\kappa_x, \kappa_y, \kappa_z)$ of a ray, with the target in the xy plane. The representation in pupil space may be continuous, rather than in terms of discrete pixels; this can be achieved using a suitable interpolation method. Also available will be the inverse mapping, i.e., from Î to I.

The derivatives for the illumination angle θ, as has already been stated, is affected by both geometrical effects and target-response effects, in that diffraction efficiency or reflectance $R(\lambda, \theta)$ depends on both wavelength and angle of incidence. However, the inventors have appreciated that, upon closer inspection, the reflectance $R(\lambda, \theta)$ appears to be approximately invariant under the transformation:

$$(\lambda, \theta) \to \left( \lambda \frac{\cos\theta'}{\cos\theta}, \theta' \right) \qquad (2)$$

and therefore:

$$R(\lambda, \theta) \approx R\left( \lambda \frac{\cos\theta'}{\cos\theta}, \theta' \right) \qquad (3)$$

for θ, θ' between 20 and 70 deg, where θ, θ' are two different values of the angle of incidence. It is therefore proposed to determine the partial derivative for the drift parameter θ based on this transformation.

Figure 11:
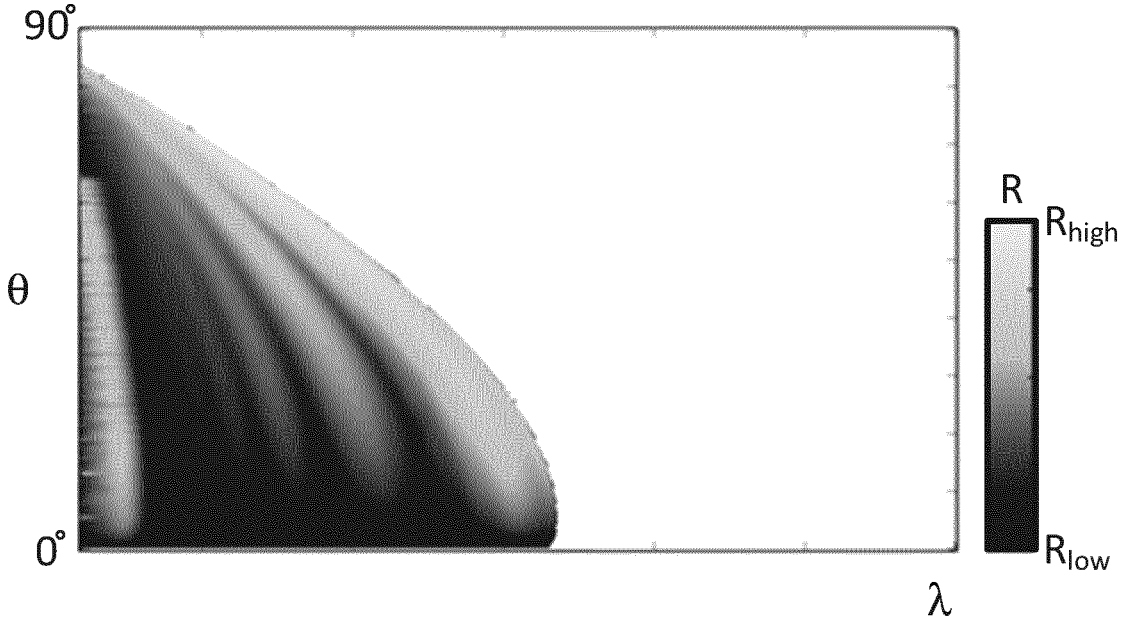
FIG. 11 is a reflectivity plot showing variation in a reflectivity metric from a target with illumination angle $\theta$ (y-axis) and wavelength $\lambda$ (x-axis)

FIG. 11 is a reflectance or diffraction efficiency plot of illumination angle θ against wavelength λ which illustrates this. The reflectance/diffraction efficiency R is described by the shading from low reflectance $R_{low}$ (dark) to high reflectance $R_{high}$ (light). This plot illustrates that, for a diffraction coefficient value R there is a predictable set of (λ, θ) pairs forming the visible lines or ridges of seen in the shading of the plot. As such, for each (λ, θ) pair of a particular diffraction coefficient value R, it is possible to reconstruct in a predictable manner, other (λ, θ) pairs having the same diffraction coefficient value.

More specifically, this invariance can be understood in terms of interference between different layers of the target; with layer-to-layer distance h, the phase difference between reflections from the upper and lower layers is $4\pi h \cos(\theta)/\lambda$, which can be seen to be indeed invariant under the above transformation. This is valid at least at SXR wavelengths, where the refractive index is always close to 1.0.

Based on this and substituting c=2 cos θ, the reflection coefficient for diffraction order n can be written as $R_n(\lambda, c)$, and has the partial derivative $$\frac{\partial R_n}{\partial c}$$

in terms of c (and therefore illumination angle θ) which can be expressed as:

$$\frac{\partial R_n}{\partial c} = -\frac{-\lambda c'}{c^2} \qquad (4)$$

$$\frac{\partial R_n}{\partial \lambda} = \frac{c'}{c}$$

$$\frac{\partial R_n}{\partial c} = -\frac{\lambda}{c} \frac{\partial R_n}{\partial \lambda}$$

It is more convenient to define the reflection coefficient in pupil space. In order to keep the math clearer and more manageable, the example below will describe the situation for a 1D-periodic target with planar (not conical) diffraction. The more general case of diffraction from a 2D-periodic target can be calculated along the same lines, as will be readily apparent to the skilled person. Therefore:

$$R_n'(K, c) = R_n\left( \frac{pK}{n}, c \right) \qquad (5)$$

where p is the target pitch and $K=n\lambda/p$ is the diffraction distance in pupil space, $K=\kappa-\kappa_0$, between the pupil position of the diffracted ray κ and the pupil position of the specularly reflected ray $\kappa_0$.

Assuming a flat illumination spectrum, then the diffraction pattern in pupil space is:

$$\hat{I}(\kappa, \kappa_0) = S \sum_n R_n'' \left( \kappa - \kappa_0, 2\sqrt{1 - \kappa_0^2} \right) \qquad (6)$$

based on $\cos\theta = (1 - \kappa_0^2)^{1/2}$ and where S is a scaling for the illumination (SXR) power. Here, Î is a function of two parameters. From this, it is possible to derive the expression by applying the chain rule; note that n is eliminated. It can be appreciated that a measurement provides $\hat{I}(\kappa, \kappa_0)$ for a range of κ values (the pupil space) and a single value of $k_0$ and that the nominal value is already known: $\kappa_0 = \sin\theta$. The partial derivative $\partial\hat{I}/\partial\kappa$ can be estimated from numerical differentiation:

$$\frac{\partial\hat{I}}{\partial\kappa_0} = -\frac{\partial\hat{I}}{\partial\kappa}\left[ 1 + \frac{(\kappa_0 - \kappa)\kappa_0}{1 - \kappa_0^2} \right] \qquad (7)$$

Figures 12A, 12B:
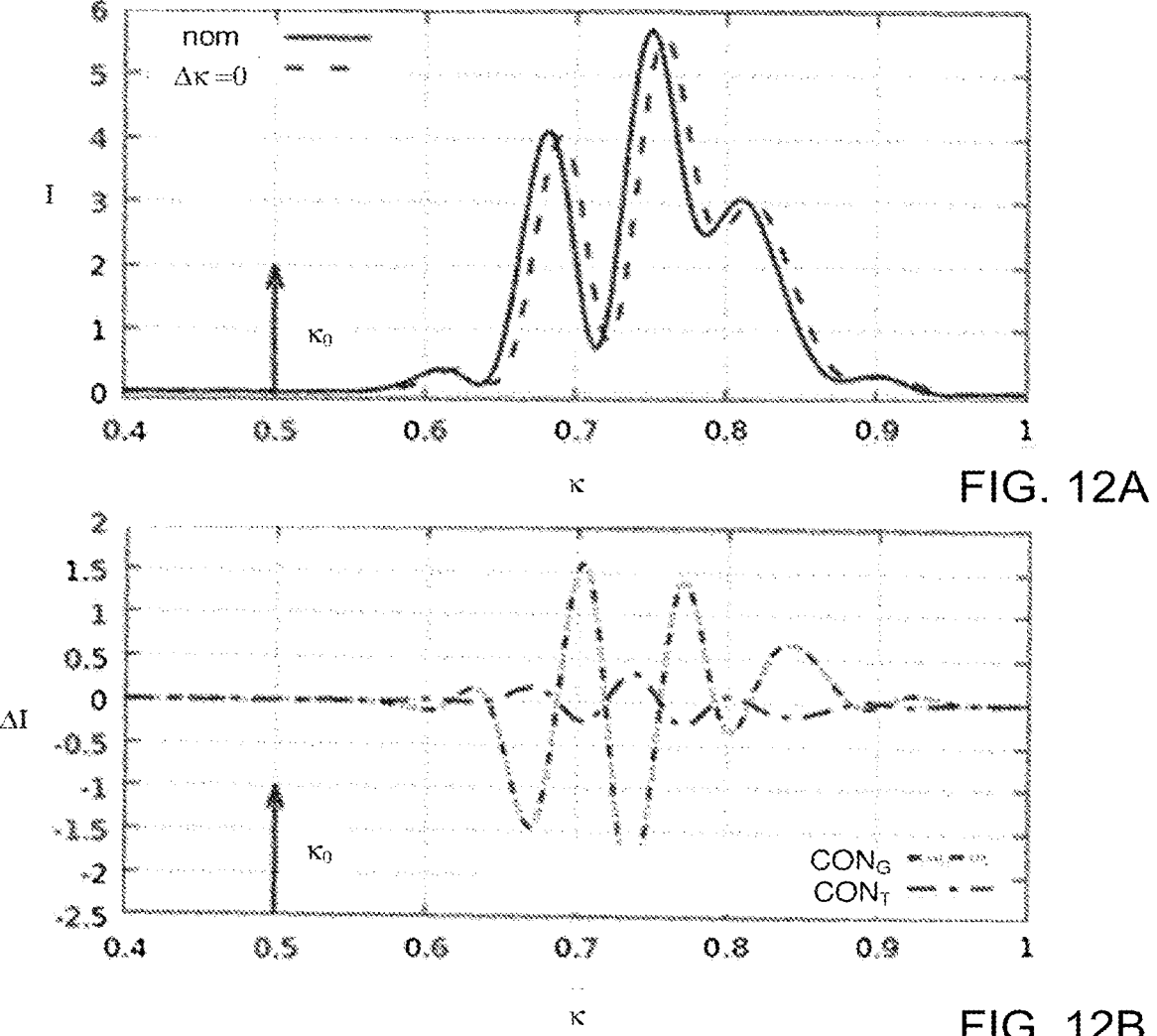
FIGS. 12A-12B show FIG. 12A a plot of intensity in pupil space (planar diffraction) with and without displaced illumination and FIG. 12B a difference between nominal and displaced signal in terms of the geometric contribution and contribution due to target response.

An example can be seen in FIG. 12 which shows (a) an intensity plot in pupil space (planar diffraction) with and without displaced illumination $(\kappa_0)$ and (b) the difference between nominal and displaced signal in terms of a contribution due to the geometrical effect $CONT_G$ and a contribution due to the target response to changes in the angle of incidence. Comparing this latter plot to Equation (7), it can be appreciated that the first term in the brackets is the contribution due to the geometrical effect and the second term is the contribution due to the target response to changes in the angle of incidence.

It can be appreciated that the quantity c=2 cos θ may be replaced by c=cos $\theta_0$+cos $\theta_d$, where $\theta_0$ is the angle with the normal of the specular reflection and $\theta_d$ is the angle with the normal of the diffracted ray.

The derivative in pupil space can be mapped back to a derivative in detector-pixel space.

The above treatment is based on an assumption of a smooth SXR illumination spectrum. In many cases this may be true, and even where this is not the case, e.g., if the SXR reflectance spectrum of the target is more 'spiky' than the illumination spectrum, it may still be reasonable approximation. Otherwise, the second term inside the brackets may include some data on the source spectrum to address particularly spiky or non-smooth SXR illumination spectra.

A further consequence of the underlying physical mechanism of the reflection spectrum being mostly a function of the expression $4\pi h \cos(\theta)/\lambda$ is that much of the above treatment described in terms of incidence angle $\theta$, can be adapted for the layer thickness h. This means that the reflectance spectrum as a function of layer thickness and wavelength is also invariant under the transformation:

$$(\lambda, h) \rightarrow \left( \lambda \frac{h'}{h}, h' \right) \tag{8}$$

and therefore $$R(\lambda, h) \approx R\left( \lambda \frac{h'}{h}, h' \right) \tag{9}$$

This can be used to construct a derivative of the target reflection spectrum R($\lambda$, h) with respect to the layer thickness:

$$\frac{\partial R}{\partial h} = -\frac{\lambda}{h} \frac{\partial R}{\partial \lambda} \tag{10}$$

Substituting $K=n\lambda/p$, for diffraction order n and target pitch p, the following can be defined: R'(K, h)=R(pK/n, h) and with some calculus:

$$\frac{\partial R'}{\partial h} = -\frac{K}{h} \frac{\partial R'}{\partial K} \tag{11}$$

In pupil space, with $\kappa=\kappa_0+K$, it can be written that $\hat{R}(\kappa,$ h)=R'($\kappa-\kappa_0$, h) and the derivative with respect to layer thickness becomes:

$$\frac{\partial \hat{R}}{\partial h} = -\frac{\kappa - \kappa_0}{h} \frac{\partial \hat{R}}{\partial \kappa} \tag{12}$$

The factor 1/h above can be interpreted as referring to the layer thickness of the topmost layer, or as a combined effect of multiple layers, i.e., $1/h=a_1/h_1+a_2/h_2+ \ldots$ with appropriate coefficients a1, a2, . . . . If the second layer from the top is thick (e.g. >50 nm), then the lower layers may have much less influence on the diffraction pattern, due to absorption losses.

It should be noted that Equation (12) is expressed in terms of reflectance (R), while the equivalent equation (7) for $\theta$ is expressed in terms of detector signals (I). The choice is entirely arbitrary. Equation (12) could be reworked in terms of detector signals, or the detector signals may be converted to reflectances before applying the corrections.

The expression for $\partial\hat{R}/\partial h$ may be used to remove any contribution to the signal caused by layer thickness variations, along the same lines as steps 1020 and 1030, described above. In this case, the value of h does not need to be known at all. Further analysis may optionally be performed to estimate the actual deviation of h from its nominal value.

As already mentioned, the method of FIG. 10 may be applied to other drift parameters; in each case the step of determining the partial derivative is more straightforward.

With respect to the dependence on azimuth angle $\varphi$; typically, the plane of incidence is chosen to be a symmetry plane of the target. Due to this symmetry, the target response has zero derivative to the $\varphi$ angle. Even if the target is slightly asymmetric (e.g., due to a small overlay error), the target-response derivative will be very small Therefore, assuming the target reflection coefficient remains unchanged, a change in azimuth angle $\varphi$ will manifest itself as an angle $\varphi$ dependent shift on the detector. The partial derivative in pupil space may be:

$$\frac{\partial \hat{I}(\kappa)}{\partial \varphi} = \nabla \hat{I}(\kappa) \cdot \left( \begin{array}{c} \sin\theta \sin\varphi \\ -\sin\theta \cos\varphi \end{array} \right). \tag{13}$$

This derivative can be converted to detector space if necessary.

The partial derivatives to detector position and orientation (e.g., to correct for changes of a position of the sensor by calculating how a moved sensor influences the image) are also relatively straightforward. They can be estimated from a single detector image (single value of i) and may therefore have different values for different images. They can also be estimated from the reference image ($I_0[j, k]$).

The partial derivatives may be determined separately for detector x position and detector y position; for example:

$$\frac{\partial I[j, k]}{\partial x} = \frac{(I[j, k+1] - I[j, k-1])}{2\,\delta x} \tag{14a}$$

$$\frac{\partial I[j, k]}{\partial y} = \frac{(I[j+1, k] - I[j-1, k])}{2\,\delta y} \tag{14b}$$

where $\delta x$ and $\delta y$ is the pixel size in the respective dimensions.

The other detector derivatives may be estimated by mapping the signal to I'(K) in pupil space, assuming the best estimate of the tool-parameter values (for example, the nominal values), then transforming back to detector space with one parameter perturbed by a small amount $\delta p$, resulting in a perturbed signal I"[j, k]. The corresponding derivative will then be (I"[j, k]−I[j, k])/$\delta p$. Optionally, a smoothing filter may be applied on the data in detector space if the signal is noisy.

Other drift parameters may include one or more parameters of the illumination supply. For example, the signal derivative with respect to illumination (e.g., SXR) power may be useful and can be estimated from only the measured signal; it is equal to the signal I[i, j, k] divided by the nominal source power in arbitrary units (one arbitrary unit may be taken equal to the nominal source power).

The signal derivative with respect to illumination (e.g., SXR) beam divergence can be estimated by convolving the signal in pupil space with a convolution kernel and subtracting the original signal from it. For example, if the nominal SXR beam has a Gaussian profile with divergence D (in pupil space), then the effect of a divergence change $\Delta D$ is equivalent to a convolution in pupil space with a Gaussian convolution kernel G that has divergence $\sqrt{2D\Delta D}$. The derivative can then be estimated as:

$$\frac{\partial \hat{I}}{\partial D} = \frac{\hat{I} * G - \hat{I}}{\Delta D}.$$

This is not a true derivative; it relies on the value of $\Delta D$ being chosen realistically, or multiple derivatives for multiple $\Delta D$ values could be taken.

In the above description, there is an assumption that the tool has been pre-aligned to an accuracy such that the position of wavelength components on the detector deviates from the expected position by significantly less than the spot size on the detector. With a typical beam divergence D=2 mrad and typical target-detector distance L=20 mm, this would mean position errors much less than 40 µm (=L*D) and angle errors much less than 2 mrad (=D).

In the above description, an example value for nominal angle or incidence θ is described as 30 degrees. This is purely exemplary and any practical angle of incidence may be used' e.g., between 10 and 90 degrees or between 20 and 90 degrees. For example, methods using SXR radiation may use an angle of incidence between 10 and 70 degrees or between 20 and 50 degrees or 20 and 40 degrees. Method using hard x-ray wavelengths, may use an angle of incidence between 85 and 90 degrees, for example.

Pupil Transformation for Compact Representation of Data

In a second main embodiment, the inference problem (i.e., how to translate a detector signal to a parameter of interest) is addressed in a different manner Note that this embodiment may be complementary (e.g., in particular with respect to the angle of incidence transformation implementation) or alternative to the above described embodiment. In particular, this embodiment describes a second method of removing nuisance parameter in measurement data, e.g., removing grating height variation. In addition, besides removing nuisance parameters, this method describes a method for inferring a profile parameter (e.g., grating height) from the measured data. Extraction of profile information will enable the use of unbalanced targets (targets with variation in e.g., height) in overlay metrology and therefore will improve the accuracy of overlay measurements. The principle is general for profile metrology and addresses the issue of profile parameter extraction (e.g., inferring layer thickness from SXR measurements) without the need for a large amount of data from targets with known layer thicknesses (or other known profile values), for which no method exists presently.

The exact thickness of such layers may not be critical for the performance of the final semiconductor product, but any variation in layer thicknesses (for example, between different targets on the same wafer) will affect the diffraction pattern e.g. the SXR diffraction pattern and may affect the inference of other parameters of interest such as overlay, unless the layer-thickness contribution in the diffraction pattern can be separated from the contributions by the parameters of interest. For example, a diffraction-based overlay (DBO) measurement using two biased targets (e.g., overlay bias +b and −b) may suffer from a difference in layer thickness between the +b and −b targets, because the layer-thickness difference will lead to an additional $A_+$−$A_-$ contribution on top of the contribution due to overlay. Here, $A_+$ and $A_-$ refers to the intensity asymmetry in the diffraction orders (e.g., the intensity difference between the +1 and −1 orders) from the +b and −b biased targets respectively.

The oscillating behavior as a function of wavelength is caused by multilayer interference. For an angle of incidence θ and layer thickness h, the reflection coefficient R as a function of wavelength λ may take the form:

$$R(\lambda, h) \approx a + b \cos\left(\frac{4\pi h \cos\theta}{\lambda} + \phi\right),$$

where a and b are positive coefficients and $\phi$ is a phase angle. In practice, this is only approximate because the expression does not account for diffraction and wavelength-dependent absorption. It explains why the oscillation has a short period for small wavelengths and a long period for larger wavelengths. For some illuminations, e.g. hard X-ray (HXR), and SXR, the signals may behave like this because the refractive index of all materials is very close to unity. For other illuminations, e.g. visible light, the mathematical relation is more involved.

In this embodiment, it is proposed to apply the following sequence of transformations to measured signals to transform the raw data to inverse pupil space:

Transform the rectangular images to pupil space, i.e., a signal $Y_\kappa(\kappa_x, \kappa_y)$. This is straightforward for the skilled person and only requires knowing the locations of the detector pixels in 3D space using techniques already described herein.

Transform pupil space to inverse coordinates $q_x,q_y$ to obtain inverse coordinate measurement data in inverse space or related data such as wavenumber data in wavenumber space. This will be described in more detail below.

Apply a method which transforms data to frequency domain, such as Fourier transform, to the signal in inverse space. The Fourier transform will be mentioned in the following embodiments just as an example while any method which transforms data to frequency domain may be applicable.

Points on a unit disc in pupil space may be described by coordinate pairs $(\kappa_x, \kappa_y)$, with $|\kappa_x^2 + \kappa_y^2| < 1$. The zeroth-order diffraction may be at coordinates $(\kappa_x^{(0)}, \kappa_y^{(0)}) = (0.5, 0)$. For diffraction at wavelength λ, diffraction 2D-orders $(m_x, m_y)$ leads to diffraction at pupil coordinates:

$$(\kappa_x, \kappa_y) = \left(\kappa_x^{(0)} + \frac{m_x\lambda}{p}, \kappa_y^{(0)} + \frac{m_y\lambda}{p}\right),$$

where p is the pitch of the target. The step of transforming pupil space to inverse coordinates may comprise making the following mapping:

$$Y_q(q_x, q_y) = Y_p\left(\kappa_x^{(0)} + \frac{1}{q_x}, \kappa_y^{(0)} + \frac{1}{q_y}\right).$$

The definition: $Y_q(0,0) \equiv 0$ may be made to prevent division errors.

The new signal $Y_q$ tends to be much closer to periodic in q than $Y_\kappa$ in terms of κ. This periodicity is reflected in its frequency spectrum, optionally Fourier spectrum, where it can be observed that the Fourier spectra have only a few narrow peaks with the peak positions being correlated to the layer thickness. Some of the peaks are related to the SXR spectrum, which is approximately periodic in 1/λ.

As an aside, it may be noted that in the transformation $Y_\kappa \rightarrow Y_q$, a scaling could be applied to preserve integrated flux, i.e., $$\int Y_\kappa d\kappa = \int Y_q dq.$$

This scaling comprises basic calculus and will not be described in further detail as its implementation would be straightforward for the skilled person.

Two potential issues with SXR metrology are that resist may shrink during SXR exposure (in 'after-etch inspection' scenarios) and that carbon may be deposited on targets during SXR exposure (carbon growth). As such, the layer thickness may vary over time due to measurement.

Figure 13:
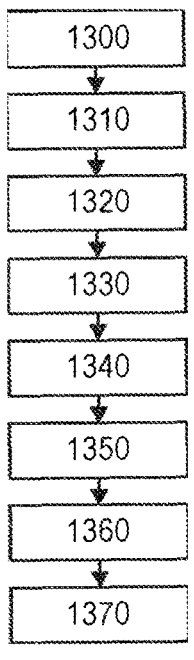
FIG. 13 is a flowchart describing a method of layer thickness inference according to an embodiment.

FIG. 13 describes a proposed method for inferring layer thickness based on the above principles. The specific example described relates to measurement of a 1D-periodic grating pattern in resist. A number of diffraction patterns were measured (i exposures) from the same target over the course of a period of time t, such that resist shrinkage may be expected to occur over that time period.

At step 1300, diffraction signal $Y_d$ (x, y, $t_i$) is obtained from the image sensors (single detector in this case; may be dual detectors), where x, y are coordinates on the sensor(s) and $t_i$ is the time of exposure number i. At step 1310, the data may be smoothed in time, resulting in $Y_d^*$(x, y, t) for continuous time. This step is optional; depending on the signal-to-noise ratio it may not give added value. At step 1320, the signal is transformed to pupil space to obtain $Y_\kappa$($k_x$, t). Note that, because the target is 1D-periodic in this example, the $k_y$ coordinate is redundant.

At step 1330, the derivative $Y'_\kappa$($\kappa_x$, t)$\equiv\partial Y_\kappa$($\kappa_x$, t)/$\partial$t at is determined. Because all changes in the signal may be presumed to be due to thickness variation e.g., resist shrink (because the same target is being measured under the same conditions), this signal encodes changes in resist thickness. Step 1340 may comprise performing the transformation described above to inverse pupil space, $Y'_q$($q_x$, t) (here only with respect to diffraction order +1).

At step 1350, the signal is Fourier-transformed. In this treatment only $q_x$>0 has been considered. The Fourier transform may take the form:

$$Y'_\Lambda(\Lambda,t)\equiv\int_0^\infty Y'_q(q_x,t)e^{2\pi i\Lambda q_x}dq_x$$

and may be approximated using fast Fourier transform (FFT) methods.

At step 1360 the distance A value of the highest peak (position of the highest peak in the Fourier domain) is determined from the Fourier transform:

$$\Lambda_0(t)\equiv\text{argmax}_\Lambda|Y'_\kappa(\kappa,t)|$$

At step 1370 the distance $\Lambda$ value may be converted to layer thickness:

$$h(t) = \frac{\Lambda_0(t)}{\cos\theta + \cos\theta^*},$$

where $\theta$ is the angle of incidence and $\theta^*$ is the average angle of the diffracted radiation with respect to normal.

Figure 14A:
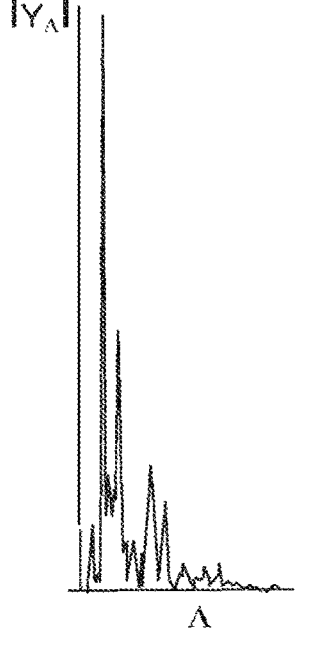
FIGS. 14A-14B show FIG. 14A a (partial) plot of a derivative signal $|Y_A|$ in Fourier space at one time period.
Figure 14B:
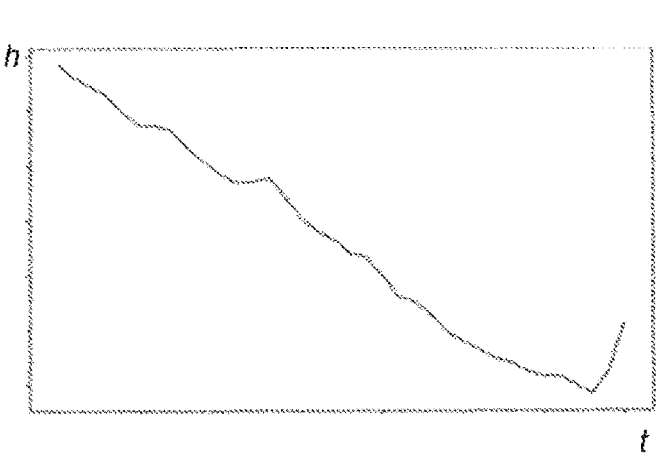

FIG. 14 shows examples of part of a Fourier spectrum obtained in using such a method and the inferred layer thickness. FIG. 14(a) shows the derivative signal $|Y_\Lambda|$ in $\Lambda$ space or distance space at one (example) t value (i.e., from one image corresponding to a single time). FIG. 14(b) shows estimated layer thickness h (corresponding to the position of the spectrum peak) for each image (i.e., over time during which resist shrinkage is occurring with time).

It may be appreciated that various refinements are possible to the above example; for example:

Account may be made for the source spectrum, ideally resulting in Y(q) representing the target reflectance spectrum in q-space, rather than diffracted power.

Account may be made for the fact that the angle of diffraction $\theta^*$ varies (predictably) over the spectrum (e.g., using methods disclosed in the first embodiment or otherwise).

A window function may be applied to the input of the Fourier transform, to reduce artifacts from the edges of the spectrum.

Both the negative and positive diffraction orders may be used.

Additional higher diffraction orders may be used (e.g., in addition to +1 order and/or −1 order, one or more of the +2, −2, +3, −3 etc. orders may be used).

In a metrology application, such an embodiment can, for example, be applied to directly infer the thickness (e.g., over time) of a (resist) grating, and correct ADI measurements for a parameter of interest (e.g., ADI overlay, or ADI focus metrology). Alternatively or in addition, this embodiment enables profilometry, by enabling inference of the thickness of e.g., small liners deposited on gratings or in trenches.

Another application may comprise inference of the height of gratings or layer thicknesses in a set of multiple overlay gratings (e.g. a DBO-type grating-pair). Differences in heights (without correction) lead to overlay errors due to so-called grating imbalance. By measuring the heights directly, grating imbalance can be detected and (potentially) also corrected for. This will improve DBO accuracy.

A possible approach to achieve this may comprise, for example, providing a third biased target on a die (having a layer-thickness difference), in addition to a first target (e.g., a +b biased target) and a second target (e.g., −b biased target). This third biased target may, for example, be identical to the first or second bias including having the same bias, except in terms of the profile parameter (e.g., it has a slightly different layer thickness). In this way, it can be assumed that signal differences between the two measurements result solely or predominately from the layer thickness difference. The different layer thickness may be deliberately imposed or otherwise. The difference between first +b target and the third target can be processed using the method as disclosed above. The inferred layer thickness can then be used to correct the overlay (or other parameter of interest) measurement. Note that it is only relevant that the biases of the first and second targets differ; the biases do not need be +b, −b. With overlay targets, the +b and −b targets are generally very close to each other; and the overlay is assumed to be the same. However, small differences in layer thickness still occur. So a third overlay target (e.g., with +b bias) next to the other two will likely see a similar layer-thickness difference. It is assumed here that the thicknesses are not dependent on exposure time, i.e., it may relate to after-etch inspection data where there is no resist.

Dependency of phase on wavelength (may be called swing curve) and separation layer thickness (including optical properties of that layer) may be used to correct the parameter of interest measurement.

Optionally one of the asymmetric part and the symmetric part of the measured diffraction pattern is used rather than the overall measured diffraction pattern.

The basic concept of this embodiment may have further application in inferring overlay or other target parameter from target measurements, in particular the asymmetric component of the measurement signal (although the symmetric part of the signal may be used for some target parameters).

Overlay-Inference Method with Reduced Sensitivity to Grating Asymmetry

In diffraction-based overlay (DBO), typically, two diffraction patterns from target pairs with positive and negative overlay biases (+b and −b, for example with b=5 nm) are obtained. For each pattern, the asymmetry (difference between the +1 and −1 diffraction orders) is obtained, i.e., $A_+$ and $A_-$, where the + and − sign refer to the sign of the bias. The overlay OV (a profile parameter) is then obtained as:

$$OV = \frac{A_+ + A_-}{A_+ - A_-} b.$$

Variations are possible, e.g., $A_\pm$ signals are measured as a function of wavelength $\lambda$ and the data for different wavelengths are combined into effective asymmetry values $$A_\pm{}^{eff} = \int A_\pm(\lambda) f(\lambda) d\lambda,$$

where $f(\lambda)$ is a suitable weighting function; the overlay is then calculated from the effective asymmetry values. A weighting function can created from a collection of targets with known overlay and can be optimized to be insensitive to noise and non-overlay target variability. For example, the end result of a method that uses singular-value decomposition tends to be mathematically equivalent to finding a suitable function $f$.

Figure 15:
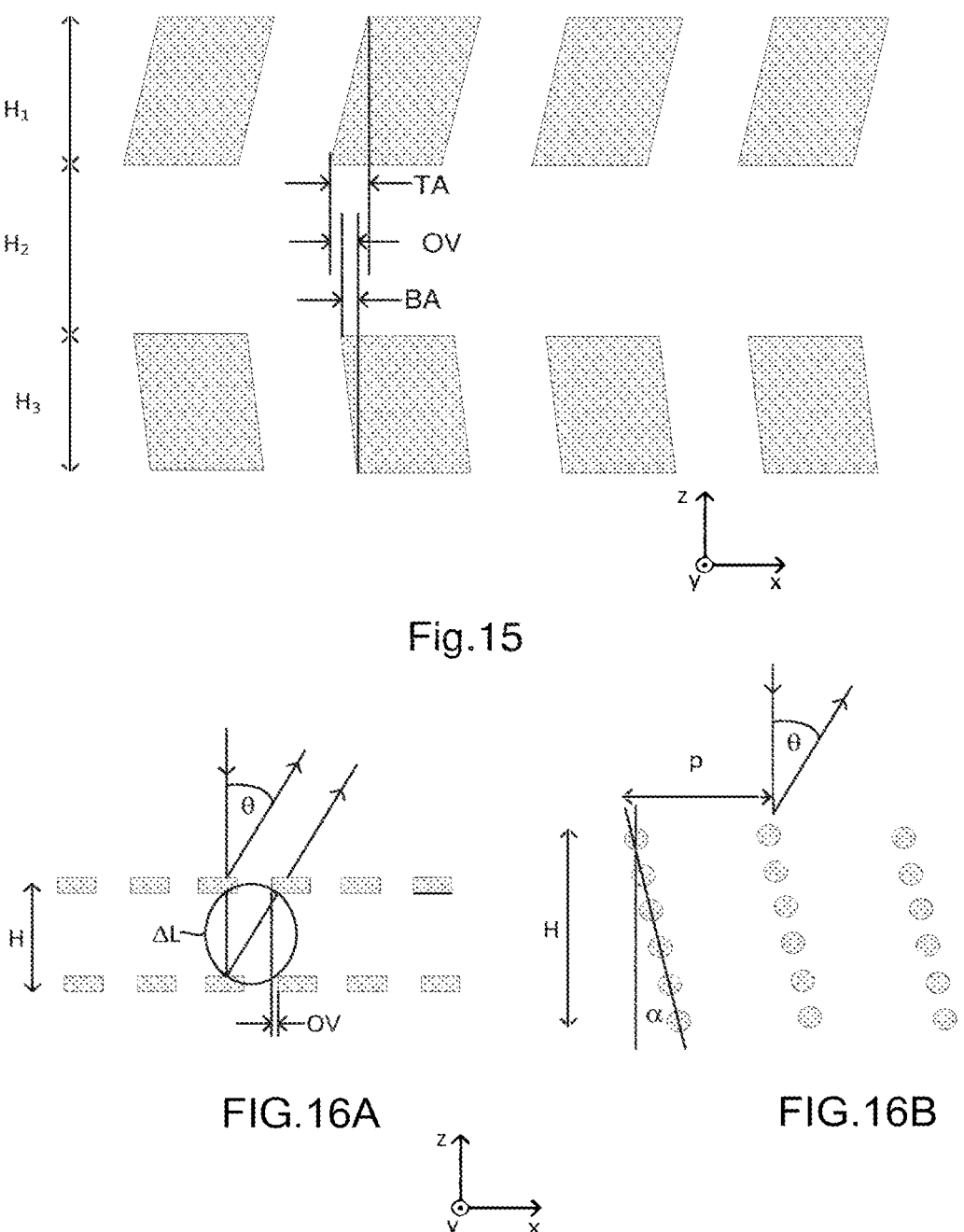
FIG. 15 is a schematic cross-sectional drawing of a target with various asymmetries.

FIG. 15 is a schematic diagram of an asymmetric target cross section which illustrates why, in practice, it can be very difficult to get accurate data from targets with known overlay values. The substrate surface plane is defined in the x/y directions and the substrate thickness in the z direction. Only the bias can be controlled easily, other (profile parameter) asymmetries cannot be controlled. The target comprises a bottom grating of height $H_3$ and a top grating of height $H_1$ separated by a gap $H_2$ (the grating separation) In addition to the desired overlay OV (including any bias), the measured asymmetry signals $A_+$, $A_-$ obtained from such a target will have additional contributions from non-overlay target asymmetries such as top asymmetry TA and bottom asymmetry BA (i.e., grating asymmetries).

In particular if the top and/or bottom asymmetry do not average to zero across the measured targets (e.g., two for a $A_+/A_-$ measurement or the hundreds of targets used to optimize a weighting function $f$), it is fundamentally impossible to eliminate its contribution to the overlay estimate. It may be simply assumed that the contribution averages to zero if measured over a sufficient number of wavelengths, but this is not necessarily the case. Also, the necessity of having hundreds of measurement targets in order to optimize the weighting function is undesirable, while any averaging assumption is far less likely to be valid over a target pair (i.e., an average based only on two measurements is far less likely to remove the unwanted contributions). It is therefore desirable to be able to obtain overlay with high accuracy from a target pair with positive and negative bias.

Another source of a measurement error is the aforementioned profile parameter referred to as grating imbalance: if the two adjacent targets (with positive and negative bias) have different values for layer thickness or grating tilt asymmetry, they are said to suffer from grating imbalance. This grating imbalance makes overlay inference even more difficult. Such grating imbalance is known to be caused by different surroundings of the targets, which is dependent on the product being exposed and therefore cannot be changed.

At SXR wavelengths, the refractive index will lie in the narrow range 0.9<n<1.0 for a wide range of materials.

Because of this, diffraction from gratings may be interpreted to act as if the gratings are weak point scatterers which have little effect on the phase of the incident wave. FIG. 16 shows two configurations of gratings as point scatterers. Once again, the substrate surface plane is defined in the x/y directions and the substrate thickness in the z direction.

FIG. 16(a) shows two gratings separated by a distance H. The diffraction efficiency (for the +1 or −1 order) may be evaluated as a function of the wavenumber $\tilde{v} = \frac{1}{\lambda}$, as:

$$R_{\pm 1}(\tilde{v}) \sim 1 + \cos\left(2\pi\left(\tilde{v}\,\Delta L \pm \frac{OV}{p}\right) + \varphi\right), \quad \text{(eq. 2)}$$

where p is the grating pitch, $\varphi$ is a phase angle dependent on the exact material properties and shape of the scatterers, and $\Delta L$ is the optical path length difference between light diffracted from the top grating and light diffracted from the bottom grating. For the geometry as shown here, $\Delta L = (1+\cos\theta)nH$, where $\theta$ is the diffraction angle. For configurations with non-normal illumination, the factor $1+\cos\theta$ must be replaced by $\cos\theta_1 + \cos\theta_2$ throughout this description, where $\theta_1$ is the angle of incidence and $\theta_2$ is the angle of the diffracted radiation with the target's normal. If the layer having height H has a refractive index $n \neq 1$, then $\cos\theta$ may be substituted with:

$$\cos\theta \to \sqrt{1 - \frac{(\sin\theta)^2}{n^2}}$$

The diffraction efficiency can be Fourier-transformed from wavenumber space ($\tilde{v}$) to distance space ($\Lambda$) as before, resulting in a distance spectrum. Note that wavenumber space is closely related to inverse space as $$\tilde{v} = \frac{1}{\lambda} = \frac{m}{p} q$$

where m is the diffraction order and p the pitch. As such, any reference to an inverse space, inverse pupil space or inverse domain should be understood to include an inverse coordinate space, a wavenumber space or a wavelength space. In this example, a peak can be expected at $\Lambda = \Delta L = (1+\cos\theta)H$.

FIG. 16(b) shows a single, tilted grating, with a tilt angle $\alpha$. In this case, $R_{+1}(\tilde{v})$ maybe derived as:

$$R_{\pm 1}(\tilde{v}) \sim H^2 \text{sinc}^2\left(\pi H\left(\tilde{v}n(1 + \cos\theta) \pm \frac{\alpha}{p}\right)\right),$$

where $\text{sinc}(x) = \sin(x)/x$. Because $H\alpha/p \ll 1$ an $\tilde{v}H(1+\cos\theta) > 1$ in practical use cases, this function is approximately periodic in $\tilde{v}$ with distance "frequency" $(1+\cos\theta)H$ (assuming $n \approx 1$).

Therefore a proposed method flow may comprise: Obtaining a diffraction pattern from a target structure comprising at least two differently biased targets; deriving a corresponding asymmetry pattern; Fourier transforming this asymmetry pattern to a depth spectrum; shifting the spectra from one or both biased targets such that their respective main peaks overlap; transforming back and performing an A+/A− analysis to obtain overlay (e.g., where overlay may be described by the slope of a A+/A− plot or similar analysis).

In such a method, the measured signal may be initially split into a symmetry component and asymmetry component. If only the layer thickness is wanted, there is no need to know the asymmetry part. To determine overlay, then the asymmetry component is used. The signal is then inversed (e.g. into the wavenumber space). This step may comprising taking a diffraction order pair (e.g., +1 and −1 orders although higher order pairs may be used) and recombining this pair into symmetric and asymmetric components. So if the diffraction pattern has an intensity profile $I_m(\tilde{v})$ for positive diffraction order m and its complement $I_{-m}(\tilde{v})$, the symmetric part may be defined as $S_m(\tilde{v})=[I_{-m}(\tilde{v})+I_m(\tilde{v})]/2$, and the asymmetric part defined as $A_m(\tilde{v})=[I_m(\tilde{v})-I_{-m}(\tilde{v})]/2$. These components $S_m(\tilde{v})$ and $A_m(\tilde{v})$ are Fourier-transformed into $S'_m(\Lambda)$ and $A'_m(\Lambda)$. Note that it is assumed below that the first orders are used (m=1,−1) and therefore will not be explicitly mentioned further.

For the overlay grating in FIG. 15, it can be expected that the diffraction asymmetry spectrum (in wavenumber space) has distance "frequency" components related to $H_1$, $H_2$, $H_3$, $H_1+H_2$, $H_2+H_3$, and so on, all having the prefactor 1+cos θ.

FIG. 17 shows example distance A spectra for (a) top asymmetry, (b) bottom asymmetry and (c) overlay, with only the asymmetry component trace shown. The arrows $L_1$, $L_2$, $L_3$ indicate the expected locations of peak amplitude A (assuming n=1) based on the three heights $H_1$, $H_2$, $H_3$ respectively. This data is based on a smooth SXR spectrum. The contributions from top and bottom asymmetry are clearly identifiable. The contribution from overlay is more complicated, but still visible. Note that these are example distance spectra from simulations, where one asymmetry parameter was set to a nonzero value. Also, it can be seen that the peak for the bottom asymmetry is far away from its expected position L3. This is a result of some of the assumptions made in this treatment; i.e., that the refractive index n is 1 and the angle of incidence $\theta_1$ is equal to the angle of the diffracted radiation with the target's normal $\theta_2$. To remove or mitigate this mismatch, a correction may be applied for refractive index in wavenumber space (described in more detail below) and the values of $\theta_1$, $\theta_2$ may be calculated for the layer(s) of interest.

FIG. 18 is a flowchart describing a method of determining a target parameter, such as overlay. At step 1800, diffraction patterns $I_+(x)$ and $I_-(x)$ are measured from targets with biases +b, −b, where x is the position on the image sensor. This step may be performed as is conventional for present overlay metrology techniques (e.g., DBO).

At step 1810, using the known target pitch, angle of incidence, and position of the image sensor, the diffraction pattern is converted to asymmetries in an inverse space such as wavenumber space: $A_\pm(\tilde{v})$, for positive $\tilde{v}$. This may use the same basic methods as already described to convert measurements to inverse space based on $$\tilde{v} = \frac{m}{p}q$$

and determination or the asymmetric component $A_m(\tilde{v})$. In the following, the notation $A_\pm$ is a shorthand for "$A_+$ and $A_-$", where $A_+$ is asymmetry from the +b biased target and $A_-$ is asymmetry from the −b biased target. In this embodiment, the vector nature of q has not been considered, i.e., only x-orders have been considered; furthermore only m=1 has been considered in this treatment.

At step 1820, the asymmetries are Fourier-transformed to complex-valued spectra in distance space, $A'_\pm(\Lambda)$.

At step 1830, the path-length difference related to overlay is calculated, e.g. $\Lambda_o=H_2$ (cos $\theta_1$+cos $\theta_2$)$\bar{n}$, where $\bar{n}$ is the average refractive index over the wavenumber range.

At step 1840, the scalar complex asymmetries are calculated: $a_+=A_+(\Lambda_o)$: $a_-=A_-(\Lambda_o)$. There may be a phase difference of approximately π between the negative-bias and the positive-bias data; if the two bias values correspond to the same overlay sign, the phase difference would be approximately zero. In an embodiment, the evaluation of the scalar asymmetries may be achieved by integrating the peak in the distance spectrum (optionally using a window function with 'soft edges'). Integration may be performed, for example, using:

$$a_\pm=\int W(\Lambda)A_\pm(\Lambda)d\Lambda$$

where $W(\Lambda)$ is a complex-valued window function (nonzero around $\Lambda_o$, zero elsewhere).

Using an estimate of the fixed phase difference φ in the equation for $R_{\pm 1}(\tilde{v})$ (see description of FIG. 16(a)), the complex amplitude in step 1840 may be converted to a real value using $$a_\pm=\text{Re}(A_\pm(\Lambda_0)e^{2\pi i\varphi}).$$

This will suppress the contribution of nuisance parameters if their contribution in the distance spectrum is out of phase with the overlay contribution. The estimated value of φ may be obtained from computer simulations or from examining a large amount of experimental data.

Finally, at step 1850, overlay may be evaluated as:

$$OV = \text{Re}\left(\frac{a_+ + a_-}{a_+ - a_-}\right)b$$

where b is the magnitude of the target bias.

One or more of the following steps may be performed, for example, in the wavenumber domain ($\tilde{v}$) (e.g., after step 1810); or alternatively before transformation from detector-position domain (x) to wavenumber domain ($\tilde{v}$):

a correction may be applied to $A_\pm(\tilde{v})$ to account for the illumination spectrum and/or the response spectrum of the detector, both of which are approximately known functions of the wavenumber $\tilde{v}$.

a correction may be applied for refractive index in wavenumber space, i.e., substitute $$A_\pm(\tilde{v}) \rightarrow A_\pm\left(\frac{\tilde{v}}{n(\tilde{v})}\right),$$

where $n(\tilde{v})$ is the real part of the refractive index of the medium of the $H_2$ layer (the medium between layers-FIG. 15 refers), which may be vertically averaged in case of a stratified medium. Following this in step 1830, set $\bar{n}=1$. This way, errors resulting from a variation of the refractive index are reduced.

A part of the signal may be filtered out by substituting:

$$A_\pm(\tilde{v}) \rightarrow A_\pm(\tilde{v})w(\tilde{v}),$$

where $w(\tilde{v})$ is a suitable window function which is nonzero only in particular wavenumber ranges. By way of specific example, at the low end, there may be overlap with the second order diffraction and at around $\tilde{v}=80.5$ $\mu m^{-1}$, there may be a discontinuity in the refractive index of silicon. Therefore the window function may be set to be zero for $\tilde{v}<60$ $\mu m^{-1}$ (to block the second order), for $\tilde{v}>80$ $\mu m^{-1}$ (to block everything above the discontinuity) or only in a narrow band around $\tilde{v}=80.5$ $\mu m^{-1}$.

In an embodiment, instead of steps 1840 and 1850, a bandpass filter (around $\Lambda=\Lambda_o$) may be applied, followed by a transformation back to wavenumber space (and optionally then back to pupil space). Any (e.g., already available) tools for feature extraction may be used in one of those spaces, such as singular value decomposition and machine learning. (These methods may be easier to apply to real-valued data rather than complex-valued data).

While specific embodiments have been described above as well as in the following texts, it will be appreciated that the descriptions of "feature extraction" are intended to be illustrative, not limiting. Feature extraction includes inferring a lithographic processing parameter, for example overlay, focus, critical dimension, grating height, target asymmetry, measurement radiation incident angle, layer thickness and/or any lithography-related nuisance parameter, a non-lithographic processing parameter, for example an optical property of the substrate and/or any non-lithography-related nuisance parameter, and/or other values which determine or can be used to calculate a property of the measured substrate and/or a nuisance parameter The biases in step 1800 may be chosen to be non-equal in magnitude, for example bias $b_-=-4$ nm and $b_+=6$ nm. This will result in a minor modification of the formula in step 1850:

$$OV = \frac{a_+ + a_-}{a_+ - a_-} \cdot \frac{b_2 - b_1}{2} - \frac{b_2 + b_1}{2}.$$

While this embodiment has been described in term of determining overlay and layer thickness, other target parameters can be extracted using the methods of this embodiment (e.g., from one or both of spectra $S'_m(\Lambda)$ and $A'_m(\Lambda)$. This may be possible in some cases without using biased target pairs (e.g., single targets).

As already stated, the above treatment is based on the approximation of a refractive index being independent on wavelength, which is false and leads to inaccuracies. A generalized treatment of the embodiments disclosed immediately above will now be described which does not rely on such an approximation. Such methods can also be used to obtain layer thicknesses from a measurement, rather than only eliminate the effect of a layer thickness variations. These principles will be expanded on further to described an additional embodiment for obtaining detailed lateral information such as critical dimension (CD), or top and bottom edge placement, from a measurement.

Correcting for the Refractive Index and Obtaining a Layer Thickness

It can be derived from the equation for diffraction efficiency provided above, that contributions to the diffraction efficiency $R_m$ for order m occur, which take the form:

$$R_m(\tilde{v})=\cos(2\pi H n \tilde{v}(\cos \theta_1+\cos \theta_2))$$

where H is the layer thickness, n the refractive index, and $\theta_{1,2}$ the angles of the incident and diffracted radiation with respect to the normal of the target surface.

A problem here is that n, $\theta_1$, and $\theta_2$ are all functions of the wavenumber $\tilde{v}$. Moreover, $\theta_{1,2}$ should be interpreted as the angles inside the layer, not as the angles in the vacuum outside the target, which means that the refractive index should be taken into account. This is illustrated in FIG. 19, which shows a target comprising four layers L0, L1, L2, L3. In this example, layers L0 and L3 each comprise a periodic structure, G1 and G2 respectively and H is the separation distance, spanning layers L1 and L2; H is a vertical distance of interest. In the figure, $\theta_{1,2}^{(0,1,2)}$ refers to angles of the incident radiation IR and diffracted radiation DR in various layers or vacuum (a vacuum is above top layer L0). The parameter $0<a<1$ describes how much layers L1 and L2 respectively contribute to the total distance H.

In this case, the expression above may be rewritten as:

$$R(\tilde{v})=\cos(2\pi H\tilde{v}C(\tilde{v})),$$

where:

$$C(\tilde{v})=an_1(\cos \theta_1^{(1)}+\cos \theta_2^{(1)})+(1-a)n_2(\cos \theta_1^{(2)}+\cos \theta_2^{(2)}).$$

and where the angles and refractive indices are all functions of the wavenumber. This is described here for two layers with refractive indices $n_1$ and $n_2$, but it can be generalized for any number of layers.

Figure 20:
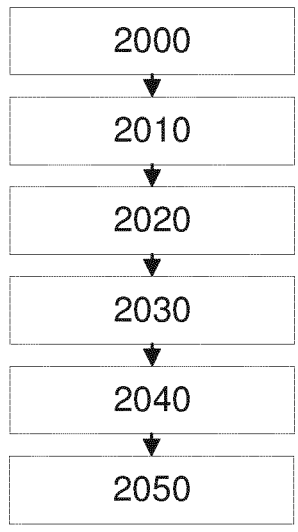
FIG. 20 is a flowchart describing a method of determining a height between layers for given diffraction signals.

FIG. 20 is a flowchart describing proposed steps for determining distance H given diffraction signals $A(\tilde{v})$ and $S(\tilde{v})$ for respectively the symmetric and asymmetric parts of the diffracted intensities (as have already been defined):

Step 2000: Estimate a, $n_1(\tilde{v})$, and $n_2(\tilde{v})$. The refractive index at SXR wavelengths can be obtained from general knowledge (e.g., public databases). For a layer containing structures of different materials, an effective refractive index is assumed. The effective refractive index may be the average refractive index (e.g., weighted by the volume fractions of the corresponding materials, or another averaging scheme). The a parameter is generally known, approximately, for a given target.

Step 2010: Use these estimates to determine the function $C(\tilde{v})$ based on the equation above and using the relation:

$$\cos \theta^{(i)} = \sqrt{1 - \left(\frac{\sin \theta^{(0)}}{n_i}\right)^2}.$$

Step 2020: Modify (e.g., smoothen) the refractive-index functions. Typically, these functions have (near-) discontinuities and/or local maxima, which would otherwise complicate the following steps (e.g., which prevent their inversion over the whole wavenumber range). The smoothening may be such that the quantity $q'_z=n(\tilde{v})C(\tilde{v})$ can be inverted as $\tilde{v}=f(q'_z)$ over the wavenumber range of interest, where $f$ is a suitable function and $q'_z$ describes positions in a reciprocal space. The modification may comprise smoothening of the refractive-index functions. Smoothening should be interpreted broadly; for example, it could mean that the refractive-index function $n(\tilde{v})$ is passed through a low-pass filter, approximated by a low-order polynomial (such as 1st order or 2nd order), or replaced by a constant value. These are merely non-limiting examples of smoothening methods.

Step 2030: Transform the $A_m(\tilde{v})$ function:

$$\hat{A}_m(q'_z)=A_m(f(q'_z))$$

and, analogously, $S_m(\tilde{v})$) as:

$$\hat{S}_m(q'_z)=S_m(f(q'_z))$$

in the remaining steps, only the asymmetric component function will be explicitly described; the analogous steps are also applied to the symmetric component.

Step 2040: Optionally, preserve the integral of the A and Â functions by defining:

$$\hat{A}_m(q'_z) = A_m(f(q'_z))\frac{df}{dq'_z},$$

and analogously for the S and Ŝ functions.

Step 2050: Fourier-transform $\hat{A}_m(q'_z)$ and $\hat{S}_m(q'_z)$ (in reciprocal space) to real space, resulting in $\hat{A}'_m(Z)$ and $\hat{S}'_m(Z)$. The layer thickness H will now occur as a peak centered around Z=H in a symmetric and/or asymmetric distance spectrum for one or more diffraction orders m. As such, this step yields a value for the layer thickness H. It has been observed that grating separation distances tend to appear as peaks in an asymmetry depth spectrum $\hat{A}'_m(Z)$ whereas grating heights also result in peaks in a symmetric spectrum $\hat{S}'_m(Z)$.

Such an approach can be demonstrated to provide good results in simulations using a realistic SXR spectrum (comprising many peaks) and significantly better than alternatives such as taking the average n or average θ angle over the spectrum.

It has also been observed that layers which neither comprise a grating nor are a single separating layer between two adjacent gratings, e.g., such as layer L1 in FIG. 19, also generate distinct peaks in the depth (distance) spectrum. These peaks do not always occur at Z values equal to the layer thickness, however it may be possible to infer their thickness from the depth spectrum using techniques disclosed herein.

Instead of splitting the intensity signal $I_{\pm m}(\tilde{v})$ or diffraction efficiency $R_{\pm m}(\tilde{v})$ into symmetric and asymmetric components prior to Fourier-transforming the components, it is possible to combine a pair (m, −m) of diffraction orders as:

$$R_m^{(combi)}(\tilde{v}) = \begin{cases} R_m(\tilde{v}) & (\tilde{v} > 0) \\ R_{-m}(\tilde{v}) & (\tilde{v} < 0) \end{cases}.$$

After Fourier-transformation, the signal can be split into symmetric and asymmetric components using the well-known properties of the Fourier transform; the Fourier transform of the symmetric part is the real part $\Re$ ($R_m^{(combi),}(Z)$) and that of the asymmetric part is the imaginary part $\Im$ ($R_m^{(combi),}(Z)$).

Extracting Features Related to CD, Layer Thickness, Overlay, and/or Sidewall-Angle Asymmetry.

Many of the concepts already described (or to be described) may be generalized into a method for determining various profile parameters such as dimensional features (placement and size values) including CD and edge placement values, overlay and SWA asymmetry. Such a method enables determination and monitoring of edge placement error EPE and/or a full reconstruction (in 3D or fewer dimensions) of a feature.

In 3D reciprocal space (with the target being in the xy plane and periodic along x with period $p_x$ and periodic in y with period $p_y$) or momentum transfer space, the momentum transfer vector may be defined as:

$$q'_{m,m'} = \begin{pmatrix} (\tilde{v}_{m,m'} - \tilde{v}_{0,0}) \cdot e_x \\ (\tilde{v}_{m,m'} - \tilde{v}_{0,0}) \cdot e_y \\ (\tilde{v}_{m,m'} - \tilde{v}_{0,0}) \cdot e_z \end{pmatrix}. \qquad \text{(eq. E2.1)}$$

where m, m' are the diffraction order numbers in x and y, respectively. This can be written more compactly as:

$$q'_{m,m'} = \tilde{v}_{m,m'} - \tilde{v}_{in} \qquad \text{(eq. E2.2)}$$

where $\tilde{v}_{in}$ is the incident wavevector, which differs from $\tilde{v}_0$ in the sign of its z component. The z-component of q' is consistent with q'$_z$ as described under the embodiment described immediately above.

For diffraction from a target which is periodic in x and y, the Cartesian components of q have the properties:

$$q'_x = \frac{m}{p_x}, \quad q'_y = \frac{m'}{p_y}, \quad q'_z = \tilde{v}(\cos\theta_1 + \cos\theta_2). \qquad \text{(eq. E2.3)}$$

Or alternatively:

$$q'_z = \tilde{v}\left[\sqrt{1 - \left(\kappa_x^0 + \frac{m}{\tilde{v}p_x}\right)^2 - \left(\kappa_y^0 + \frac{m'}{\tilde{v}p_y}\right)^2} + \sqrt{1 - \left(\kappa_x^0\right)^2 - \left(\kappa_y^0\right)^2}\right], \qquad \text{(eq. E2.4)}$$

where ($\kappa_x^0$, $\kappa_y^0$, $\kappa_z^0$) is the direction unit vector of the zero-order reflected radiation (as has been defined previously).

By way of a specific example, if $\tilde{v}_{0,0}$=(0, 0, 100)μm$^{-1}$ in Cartesian coordinates (wavelength 10 nm at normal incidence), and 1/p$_x$=10 μm$^{-1}$, then $\tilde{v}_{2,0}$=(20, 0, 98)μm$^{-1}$ and q'$_{2,0}$=(20, 0, 198) μm$^{-1}$.

Figure 21:
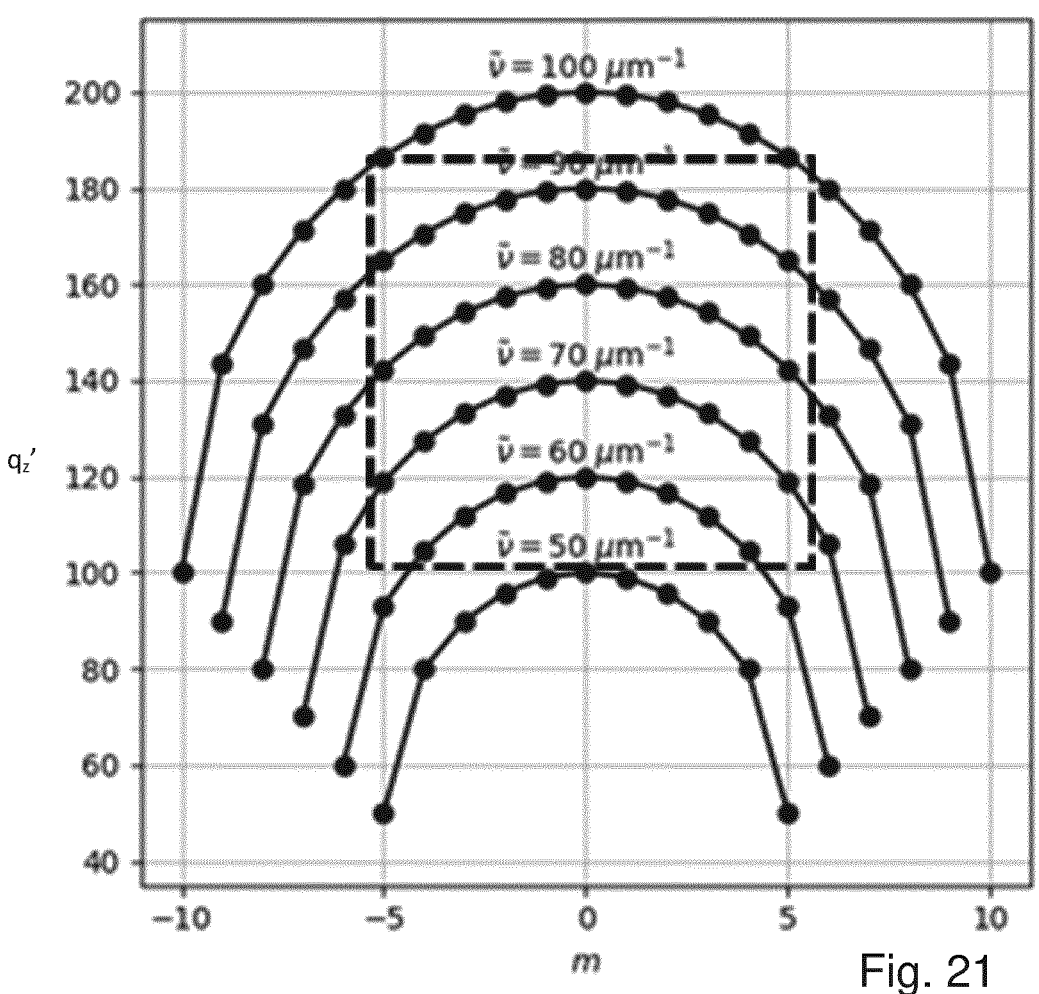
FIG. 21 is a plot showing mapping from $(m, \tilde{v})$ to $(m, q_z)$ for $p_x=0.1$ μm and normal incidence.

The measured diffraction efficiency $R_m(\tilde{v})$ or $R_{m,m'}(\tilde{v})$ can be mapped to momentum-transfer space as $\hat{R}(q')$ either using any of equations E2.1 to E2.3, or, equivalently, as $\hat{R}_{m,m'}(q'_z)$. FIG. 21 is a plot illustrating an example of such mapping, more specifically a mapping from (m, $\tilde{v}$) to (m, q'$_z$) for a specific example of p$_x$=0.1 μm and normal incidence; the significance of the dashed rectangle will be explained below. Note that FIG. 21 shows discrete wavenumbers; in practice, the wavenumbers will span a continuous range, whereas the diffraction-order number (m) is discrete as shown.

Part of the thusly remapped $\hat{R}_{m,m'}(q'_z)$ can now be Fourier-transformed as:

$$R'(X, Y, Z) = \int_{q'_{z,a}}^{q'_{z,b}} \sum_{m,m'} \hat{R}_{m,m'}(q'_z)\exp\left(\frac{2\pi imX}{p_x} + \frac{2\pi im'Y}{p_y} + 2\pi iq'_z Z\right)dq'_z,$$

where the integration limits q'$_{z,a}$ and q'$_{z,b}$ can be chosen to encompass all available data or a subset thereof.

Note that the factors 2π in this Fourier transform can also be replaced by −2π; in this case, most other factors 2π in the equations in the following description will also need to be replaced by −2π.

The proposed method comprises determining one or more profile parameters (e.g., positional and/or size parameters) from the size and/or position and/or a configuration (e.g., shape) of a corresponding one or more of regions of higher amplitude in a reconstruction signal (e.g., R'(X, Y, Z) in three dimensions although the reconstruction signal may comprise fewer dimensions) represented in a real space.

The regions of higher amplitude may correspond to a different one of said one or more positional and/or size parameters. For example, the position of the regions of higher amplitude corresponding to a first direction (i.e., regions of Z values having higher amplitudes, where Z corresponds to a direction perpendicular to a substrate plane), in said real space may be indicative of one or more of said positional and/or size parameters in said first direction. The one or more of said positional and/or size parameters in said first direction may comprise heights of one or more structures; and/or distances between one or more structures and/or features thereof. For example, different regions of higher amplitude may respectively correspond to different distance measurements relating to the same two structures; i.e., distances between different features on these structures. By way of specific example, a first region may correspond with a distance between a top of a first feature and a top of a second feature and a second region may correspond with a distance between a bottom of the first feature and the top of the second feature.

The size and/or position and/or a configuration of the regions of higher amplitude corresponding to a second and/or third direction parallel to a substrate plane (i.e., regions of X and/or Y values having higher amplitudes) may be indicative of one or more of said positional and/or size parameters in said second and/or third direction. Such positional and/or size parameters may include, for example a width, critical dimension or any other dimension of a structure; a difference in widths, critical dimensions or any other dimensions of between any two structures or features of a structure (e.g., between top and bottom of a structure); an overlay or offset between two structure; and/or a structural asymmetry in a structure. The size and/or position and/or a configuration of said regions in the second and/or third direction may comprise one or more of: an offset of one or more of said regions with respect to an origin; a width of one or more of said regions; and/or a dimension of a flat region of a contour or profile of one or more of said regions.

Figures 22A, 22B, 22C, 22D:
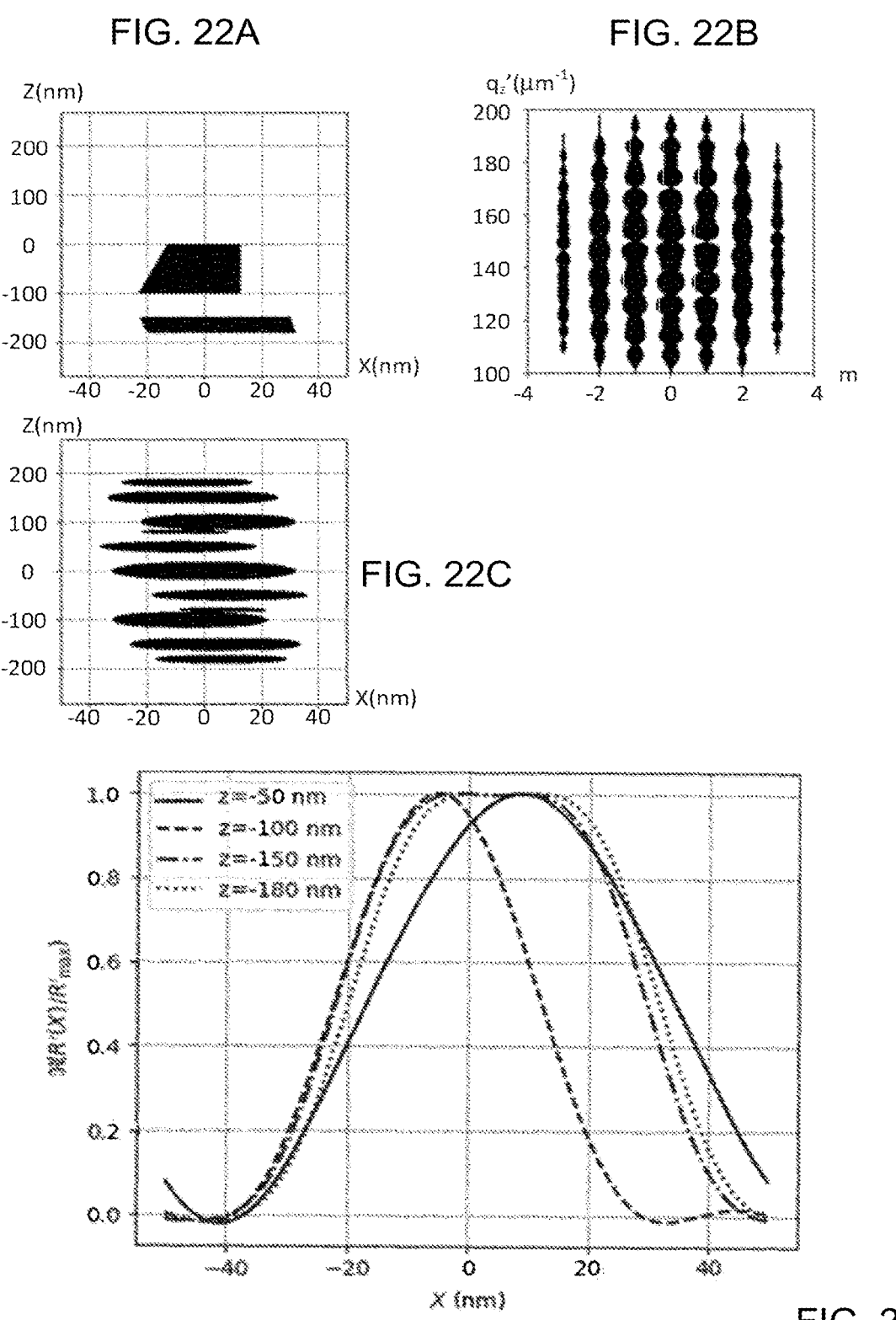
FIGS. 22A-22C show plots of FIG. 22A a unit cell of an overlay target in X, Z space, FIG. 22B a plot of the target's diffraction efficiencies and FIG. 22C a plot of the target's reconstruction signal.

FIG. 22 shows an example 2D dataset illustrating this embodiment according to a simplified calculation, with an approximation for small refractive-index variations. FIG. 22($a$) is a 2D real-space plot of density as function of X and Z (i.e., in X, Z space) representing a unit cell of an overlay target being measured. The target comprises a top grating of height 100 nm and a bottom grating of height 30 nm, the two gratings separated by 50 nm. The top grating is tapered from critical dimension (width) CD=25 nm to CD=35 nm; the bottom grating has a CD=50 nm. FIG. 22($b$) is a plot of diffraction efficiencies $\hat{R}_m(q'_z)$ against m where the width of each black area represents the logarithm of the diffraction intensity. FIG. 22($c$) is the (2D) reconstruction signal R'(X, Z) comprising an autocorrelation of amplitude in X, Z space. Each black region on this plot represents the area where the correlation amplitude is >5% of the maximum value occurring in the plot (i.e., a region of higher amplitude). Note that this is only an example threshold and other thresholds or criteria may be used to determine these black regions or regions of higher amplitude. FIG. 22($d$) is a plot of the real value $\Re$ (R'(X)/R'$_{max}$) showing a few slices of the R' values for the data represented in FIG. 22, with all curves scaled to a maximum value 1. As can be seen from FIG. 22($c$), the Fourier-transformed data R'(X, Z) has point symmetry around the origin; the following description will only describe the parts of this Figure for Z≤0:

a feature at Z=−100 nm corresponds to the top-grating height. The X offset of −5 nm corresponds to the top-grating tilt asymmetry. The full width at half maximum (FWHM) of 35 nm (see FIG. 22($d$)) is equal to the width (CD) of the bottom of the top grating.

a feature at Z=−50 nm corresponds to the grating separation distance, i.e., the distance from the bottom of the top grating to the top of the bottom grating. The X offset of 10 nm corresponds to the overlay (center of the bottom of the top grating versus the center of the top of the bottom grating). The FWHM is 51 nm, very close to the width (CD) of the bottom grating (50 nm).

A feature at Z=−150 nm corresponds to the distance from the top of the top grating to the top of the bottom grating; the X offset of 5 nm corresponds to the center offsets of the respective features. The FWHM is 52 nm, very close to the width (CD) of the bottom grating (50 nm). The curve has a flat-top character; its width is close to the difference between CD=30 nm (top of top grating) and CD=50 nm (bottom grating).

A feature at Z=−180 nm corresponds to the distance from the top of the top grating to the bottom of the bottom grating. The X offset of 8 nm corresponds to the center offsets. The flat-top character is as with the feature at Z=−150 nm.

A faint feature at Z=−80 nm (visible on FIG. 22($c$) only; not plotted on FIG. 22($d$)) corresponds to the distance between the bottom of the top grating and the bottom of the bottom grating.

The height of the bottom grating is not visible at Z=−30 nm because it is drowned in the bright feature around Z=0. However, the it does appear as the distance between the features at Z=−150 and Z=−180 nm.

In general, if two features with widths a and b are cross-correlated as in FIG. 22($d$), then the FWHM will be:

$$\text{FWHM} \approx \max(a,b) \text{ if } a+b \leq p \text{ and}$$

$$\text{FWHM} \approx p - \min(a,b) \text{ if } a+b \geq p$$

The FWHM is defined at the mid-point between the highest and lowest value in the cross-correlation curve. Note that the FWHM relates to the quantity $\Re$ (R'(X)/R'$_{max}$); R' is a complex-valued function that may have zero crossings. FWHM is only defined for a real-valued function; hence this formula, which allows the real-valued curve to have both negative and positive values. Any suitable transformation from complex R' to real-valued R' (allowing positive and negative values) may be used.

From each of these features, it is possible to reconstruct a geometrical picture of the full overlay target, including the 3D EPE aspects.

In what follows, references to R'(X, Z) may be interpreted as a 2D example that can be generalized for the 3D case with R'(X, Y, Z). Likewise R'$_{m,m}$(Z) is for the 3D case, but can also be replaced by R'$_m$(Z) for a 2D case. As such, this embodiment can be used with data and equivalent representations in 1, 2 or three dimensions.

For extracting CD-related information directly from the R'(X, Z) space, it is generally necessary to use at least either orders {−1, 0, 1} or orders {−2, −1, 1, 2}. (The example is for |m|≤3.) There may be exceptions: for example, if the target includes layers with different pitches (e.g. half or double), these requirements may differ. It is possible to use only orders m=±1, but then the CD will affect the amplitude of the R' signal. Because of this, a calibration using simulation data or data from targets with known CD values will be necessary to translate the amplitude into a CD value.

Mathematically, the Fourier transform from $\hat{R}_m(q'_z)$ to R'(X, Z) (for the 2D case) is equivalent to computing an autocorrelation function of the unit cell. Because $\hat{R}$ is not available for $q'_z \approx 0$, it will appear slightly different from a standard autocorrelation function. The curves in FIG. 22(*d*) can be interpreted as cross-correlation functions of edges in the unit cell at different Z values.

Summarizing, this embodiment allows estimation of in-plane feature sizes (CD and CD-like parameters), overlay, relative top- and bottom positions of features (e.g., top grating bottom surface in an overlay target), grating tilt (grating asymmetry), and vertical distances, from a single measurement, without the need for training data from measurements or simulations (however, machine learning could optionally be used to improve accuracy).

Variants of the Feature Extraction Embodiment

1) The Fourier transform may be performed over a rectangular region in m, $q'_z$ space. Using the example of FIG. 21, assuming that data is available for the wavelengths and orders as shown, the Fourier transform may be performed to cover the area inside the dashed rectangle, with m= $\{-5, \ldots, 5\}$, $q'_{z,a} = 100$ μm$^{-1}$, and $q'_{z,b} = 185$ μm$^{-1}$, so that there is no missing data inside this range. A differently shaped region in (m, $q_z$) space may also be selected such that for every $q'_z$ value, a contiguous range of m values is covered. For example, with a radiation source configuration as in FIG. 21 spanning wavenumbers 50 μm$^{-1}$ < $\tilde{v}$ < 100 μm$^{-1}$, $q'_z$ values below 100 μm$^{-1}$ may be excluded because $\hat{R}_m(q'_z)$ is only defined for higher diffraction orders, whereas $q'_z = 197$ μm$^{-1}$ may be included because it has the contiguous range $-2 \le m \le 2$ available. The selected region may be symmetric in m so that for each positive m value at a given $q'_z$ value, the corresponding $-m$ order is available, and for each positive m' order, the corresponding $-m'$ order is available. (This is especially relevant for 2D-periodic targets at non-normal illumination.)

2) A window function may be applied to the $\hat{R}_{m,m'}(q'_z)$ data prior to Fourier-transforming. The window function may be 1D, 2D, or 3D. For example, the data in FIG. 22 was processed with a Hann window along the $q'_z$ direction.

3) A non-contiguous range of orders may be selected; for example the order m=0 may be omitted. By way of a specific example, selecting only m=±1 will cover $A_+/A_-$ type of inference presently used in e.g., overlay metrology.

4) A region in (m, $q'_z$) space may be selected covering combinations that can be extracted unambiguously, given a broadband SXR source. For example, with an SXR source spanning $\tilde{v}$ values spanning 50 μm$^{-1}$ to 100 μm$^{-1}$ (10 nm to 20 nm), normal incidence (as in FIG. 21), and target pitch 100 nm, the range 100 μm$^{-1}$ to 200 μm$^{-1}$ may be covered for order m=0, the range 99 μm$^{-1}$ to 199 μm$^{-1}$ may be covered for orders m=±1, and the range 130 μm$^{-1}$ to 198 μm$^{-1}$ may be covered for orders m=±2. Thus the ambiguity between the m=3 order for $\tilde{v} \le 100$ μm$^{-1}$ and the m=2 order for $\tilde{v} \le 66.7$ μm$^{-1}$ can be avoided.

5) The Fourier transform may be performed to cover only one or two dimensions rather than three (for the 3D case). For example, it is possible to transform only over $q'_z$. Then be selecting an order pair ±m an $A_+/A_-$ overlay inference may be performed similarly to the overlay inference method described in relation to FIG. 18. Asymmetry may be defined as:

$$A(Z) = \frac{R'_m(Z) - R'_{-m}(Z)}{R'_m(Z) + R'_{-m}(Z)}$$

for a particular choice of m, for example m=1. This asymmetry is generally complex-valued. With two targets having biases ±b, measured asymmetries $A_\pm$, and unknown overlay OV, the overlay can be estimated as $$OV = b \times \Re\left(\frac{A_+ - A_-}{A_+ + A_-}\right).$$

i.e., this demonstrates that this present embodiment is a generalization of the method described by FIG. 18.

6) After Fourier transforming, a phase-gradient correction may be applied, i.e., $$R'(X, Y, Z) \to R'(X, Y, Z)\exp\left(-\frac{2\pi i \mu X}{p} - \frac{2\pi i \mu' Y}{p} - 2\pi i Q'_z Z\right),$$

where μ and μ' are suitably chosen numbers and $Q'_z$ is a suitably chosen wavenumber, such that the phase of R' varies less rapidly as a function of X, Y, or Z. This phase gradient can also be applied selectively to one or two of the three dimensions. Typically, μ, μ', $Q'_z$ may be chosen to be the average of m, m', $q'_z$ weighted by $\hat{R}_{m,m'}(q'_z)$.

7) The X-position of a feature in R'(X, Z) may be estimated from the complex-valued pair $R'_m(Z)$, $R'_{-m}(Z)$, in particular from the pair m=±1. For example, one of the following expressions may be used:

$$\hat{X} = \frac{-p}{2\pi m}\arctan\left(\Im\left(\frac{R'_m(Z) - R'_{-m}(Z)}{R'_m(Z) + R'_{-m}(Z)}\right)\right)$$

$$\hat{X} = \frac{-p}{4\pi m}\arg(R'_m(Z)\overline{R'_{-m}(Z)}),$$

where the overline indicates the complex conjugate. This may equally be represented as:

$$\hat{X} = \frac{-p}{4\pi m}\arg(R'_m(Z)) - \arg(R'_{-m}(Z))$$

where both representations extract the phase difference between two complex values (e.g., of similar magnitude).

Thus, the overlay or grating-tilt asymmetry can be inferred from a single measurement. These expressions are only an approximation. However, these expressions are exact if a pair of positive and negative diffraction orders is related as:

$$R'_{\pm m}(Z) = c_{|m|}(Z)\exp\left(\mp\frac{2\pi i m \hat{X}}{p}\right),$$

where $c_{|m|}$ is a complex value not dependent on the sign of m.

8) Where it is desired to combine measurements from two or more biased targets for overlay, this may be done based on the R'(X, Z) representation; if a particular Z value $Z_o$ is known to be associated with overlay (for example $Z_o$=50 nm in FIG. 22(*c*) or (*d*)), then an effective value $\hat{X}$ can be evaluated for the two bias values, i.e. $\hat{X}_+$ and $\hat{X}_-$ for biases +b and −b from measurements $R'_+(X, Z)$ and $R'_-(X, Z)$ corresponding to $Z_o$. The inferred overlay is then given by:

$$OV = b \frac{\hat{X}_+ + \hat{X}_-}{\hat{X}_+ - \hat{X}_-}.$$

Example for the effective values $\hat{X}_\pm$, may include: the mean, median, or modus of the function $|R'_\pm(X, Z_o)|$, one of the expressions for $\hat{X}$ above, or other similar metrics. $R'(X, Z)$ may also be integrated over a range in Z around $Z=Z_o$.

9) If the biased measurement pair as described above is affected by grating imbalance, this may manifest itself as the overlay features occurring at slightly different $Z_o$ values, for example $Z_{o+}=50$ nm and $Z_{o-}=51$ nm. $\hat{X}_+$ and $\hat{X}_-$ can be obtained respectively from $R'_+(X, Z_{o+})$ and $R'_-(X,Z_{o-})$. This is a generalization of the embodiment "Detection and correction of grating imbalance for DBO" described below.

10) If one is only interested in overlay, CD, or other features in X-space and not in a precise measurement of layer thicknesses (Z-space), the measurement interpretation becomes insensitive to small errors in the angle of incidence. For example, if the angle of incidence is nominally 45 degree, but the true angle of incidence was 45.1 degree, this will lead to a small shift of the Z positions of the features in $R'(X, Z)$. This is not a problem for the inference of X-related features. This is a generalization of the "Tool-alignment correction" embodiment described herein.

11) The data may be corrected for the actual refractive index of the target or target layers (the above examples are for a refractive index that is very close to n=1 across the entire target). This correction may be applied prior to the conversion from $R_{m,m'}(\tilde{v})$ to $\hat{R}_{m,m'}(q'_z)$. The correction is specific for the material of the layers spanning a given vertical distance; multiple corrections for different layer sets may be applied to the same input data $R_{m,.}(\tilde{v})$, resulting in multiple $R'(X, Y, Z)$ or multiple $R'_{m,m'}(Z)$ datasets. These multiple datasets may be combined or may be interpreted individually.

12) Analogously to earlier embodiments, the signal may be split into symmetric and asymmetric parts in (m, $q'_z$) space, with $A_m(q'_z)=-A_{-m}(q'_z)$ and $S_m(q')=S_m(-q'_z)$ and their Fourier transforms considered separately. This split can also be done after the Fourier transform.

13) A user may want to optimize process parameters such that the critical dimension has a particular desired value. An example of a process parameter is the exposure dose on the resist. The cross-correlation curves (functions) in FIG. 22(d) do not have sharply delimited features. This is a result of the optical diffraction limit. To determine the CD value of a feature from such curves, a criterion, such as a threshold value, may be defined. This threshold can be calibrated by using the fact that the diffraction in nonzero even complementary diffraction orders (±2, ±4, . . . ) vanishes in the specific case where the CD equals half the pitch. The user may achieve this by performing the following steps:

Create a series of targets with a process parameter varied, such that the CD is varying.

Use the method of this embodiment to obtain cross-correlation curves (for a particular value $Z=Z_o$) related to the CD.

Identify a target where the $R'_2(Z_o)$ and $R'_{-2}(Z_o)$ are close to zero. Find a threshold value such that the part of the cross-correlation curve that is above the threshold has a width equal to half of the target pitch.

Use the threshold found in step c to assign CD values to the other cross-correlation curves.

14) The CD can also be estimated directly from the $R'_m(Z)$ representation of the data. Defining a=CD/p (the CD/pitch ratio) and where CD is known to correspond to a particular value $Z=Z_o$, then the following relation may hold approximately:

$$\frac{|R'_m(Z_o)|}{|R'_0(Z_o)|} = \left(\frac{\sin(\pi m a)}{\pi m a}\right)^2.$$

Hence, if for example $R'_0$ and $R'_1$ are known, or if $R'_1$ and $R'_2$ are known, it is possible to solve for a and thus obtain the CD.

If $Z=Z_o$ is known to be related to the cross-correlation of two features with two different CD values, i.e., $CD_1$ and $CD_2$, one can define $a=CD_1/p$ and $b=CD_2/p$. The above equation then becomes $$\frac{|R'_m(Z_o)|}{|R'_0(Z_o)|} = \frac{|\sin(\pi m a)\sin(\pi m b)|}{\pi^2 m^2 ab}.$$

If $R'_m(Z_o)$ is known for three m values, for example, m=0, 1, 2, the values may be solved for a and b. Alternatively, if either a or b is known through other means, then the other one can be obtained from $R'_m$ values for just two m values.

15) Although the math is written starting from diffraction efficiencies R, the procedure may also be applied to diffracted intensities I, i.e. the product of source spectral intensity and target diffraction efficiency. An approximation may be made that the intensity in pupil space ($\kappa_x$, $\kappa_y$) can be translated into (m, m', $\tilde{v}$) space or (m, m', $q'_z$) space based on a precise ($\kappa_x^0$, $\kappa_y^0$) pupil coordinate for the zeroth order, even if the illumination spans a (narrow) range of pupil coordinates, as defined by the numerical aperture of the illumination optics. The source may use high-harmonic generation, resulting in a source spectrum that has multiple peaks that are spaced by a fixed intervals in wavenumber ($\acute{v}$) space, for example approximately 25 peaks from 51 $\mu m^{-1}$ to 99 $\mu m^{-1}$ with a spacing of approximately 2 $\mu m^{-1}$. This will lead to the diffraction efficiency $R_m(\tilde{v})$ to be sampled at fixed intervals, and the diffraction efficiency $\tilde{R}_m(q_z)$ at approximately fixed intervals. As is generally known in signal processing, this will lead to aliasing: after Fourier transforming the diffracted intensity I from reciprocal space to real space as $R'_m(X)$ or $R'(X, Z)$, a single layer thickness H will occur at multiple Z values in $R'_m(Z)$ or $R'(X, Z)$. For example, overlay may appear as be related to the $R'_m$ value both at a first value $Z=Z_o^{(1)}$ and at a second value $Z=Z_o^{(2)}$, and possibly more values as well. Inference of a single structure parameter such as overlay can be done for one or more of these $Z_o$ values.

16) In order to measure the diffraction efficiency $R_{m,.}(\tilde{v})$ for a wide range of wavenumbers and diffraction orders, it is possible to combine the results from multiple measurements on the same target, with different illumination spectra. Thus, it becomes possible to distinguish between, for example, the m=3 diffraction from wavelength 12 nm and the m=2 diffraction from wavelength 18 nm. Spectra can be varied by the placement of a spectral filter, such as bandpass filter somewhere in the SXR beam path, downstream from or upstream of the target. The filter may be a reflective filter or a transmissive filter. It may achieve spectral selection by means of a multilayer coating or by using the absorption properties of the material (for example, aluminum, zirconium, ruthenium, gold). A target may be designed to have a built-in multilayer structure to enhance or suppress reflectance in dedicated wavelength ranges. The SXR radiation may pass through a tuneable monochromator.

17) As shown by Eq. E2.3 and E2.4, the transformation from (m, ṽ) space to (m, q'$_z$) space depends on the angle of incidence ($\theta_1$) or generally the ($\kappa_x^0$, $\kappa_y^0$) vector of the specularly reflected radiation, which is defined both by $\theta_1$ and the azimuthal angle of illumination. By combining measurements with different angles of incidence and/or different azimuthal angles, all having the same illumination spectrum, it is possible to extend the q$_z$ range which is covered Azimuthal angles could for example be stepped in multiples of 90 degree or multiples of 180 deg.

18) The R'(X, Z) representation can be used for feature extraction in a machine learning approach. For example, R'(X, Z) itself, or the peak positions in R'(X, Z), can be used as an input for a regression model or a neural network which is further trained on reference data, either measured or simulated. This can be used to correct for assumptions used to derive R'(X, Z), e.g., the single scatter approximation (which is not strictly valid with these wavelengths), refractive indices significantly different from 1, more complex geometries, etc. This is a generalization of the embodiment "Pupil transformation for compact representation of data".

19) In case of overlapping diffraction orders, such as the third order for wavelength 12 nm and the second order for 18 nm, the ratio of the contributions generally depend on the angle of incidence or the azimuthal angle, because they sample different q$_z$ values. In the case of a broadband SXR spectrum containing for example both 12 nm and 18 nm, it is not possible to unambiguously map the entire diffraction pattern to m, ṽ space. However, it is possible to transform datasets for multiple angles of incidence each into an inverse space (as in the embodiment "Pupil transformation in SXR for compact representation of data") and use this for machine learning (ML). The combination of multiple angles of incidence will add diversity to the data, thus helping better performance of the ML algorithms. During parameter inference, the trained ML algorithm may be used along with, again, data acquired at multiple angles of incidence.

20) Another way to deal with overlapping orders is by means of an iterative procedure. Such an iterative procedure may comprise the following steps:

Generate a "first guess" estimate of $\hat{R}_{m,m}$(q'$_z$), for example by using Maxwell-solver software for the unit cell as designed. (Possibly generate multiple first guesses for different angles of incidence, azimuthal angles, or polarizations. For example two angles of incidence with 1, 2, 5, 10, 20, 30, 40, 45, 60, or 80 degrees difference. Larger steps are needed for angles of incidence closer to normal). While angles of incidence smaller than 20 degrees may be more practical (or essentially enforced) due to present hardware limitations of some tools, other tool designs may be envisaged which allow larger angle changes without the wafer fouling mirrors and other hardware; e.g., a broadband hard X-ray source for transmissive diffraction (TSAXS)).

Transform the estimate $\hat{R}_{m,m}$(q'$_z$) into an estimated diffraction pattern I$_e$($\kappa_x$, $\kappa_y$) using knowledge of the SXR spectrum. (Or multiple estimated diffraction patterns if the same target was measured with different angles of incidence, different source spectra, etc.)

Use the difference with the measured diffraction pattern(s) I($\kappa_x$, $\kappa_y$) to update the estimate $\hat{R}_{m,m}$(q'$_z$) such that (all) I$_e$ becomes consistent with (all) I. How to do this is known from ptychography and coherent diffractive imaging (CDI) in general.

Transform the updated estimate $\hat{R}$ to R'(X, Y, Z) representation. (Multiple R' representations if angles of incidence etc. were varied).

Update the R' representation based on constraints of physical possibilities. For example, R' must be zero at Z values that do not correspond to vertical distances between feature boundaries in the unit cell. (If there are multiple R' representations corresponding to different angles of incidence, they must be consistent in the XYZ locations of the features, but not necessarily in amplitude.)

If R' was updated significantly: transform R'(X, Y, Z) to an updated estimate $\hat{R}_{m,m}$(q'$_z$) and go back to the second step.

If R' was not updated significantly: the iterative procedure has converged. Further data analysis can be done either in the R'(X, Y, Z) representation or the R'$_{m,m}$(Z) representation, as described elsewhere in this disclosure.

21) In case of overlapping diffraction orders, such as the third order for wavelength 12 nm and the second order for 18 nm, intensities as measured in such ambiguous locations in the diffraction pattern may be assigned to multiple m, ṽ pairs in R$_m$(ṽ). For example, for a target with pitch 100 nm and an SXR spectrum ranging from 10 to 20 nm, pupil coordinates $\kappa_x$ in the range 0.2 to 0.4 are assigned to m=2 and pupil coordinates 0.3 to 0.6 are assigned to m=3. The range $0.3 \leq \kappa_x \leq 0.4$ is assigned both to m=2 and m=3. This can be seen as a hybrid approach between on the one hand the embodiment "Pupil transformation for compact representation of data" (transformation does not take into account the diffraction orders) and on the other hand a full disambiguation as in variants (16), (19), and (20) above. An advantage of this hybrid approach is that it can be used to transfer all information in a measured diffraction pattern I($\kappa_x$, $\kappa_y$) to the R'(X, Y, Z) representation. This step can be performed losslessly (since the Fourier transform is bijective) and does not require any assumptions on the overlap. Further processing, including the disambiguation of the overlap, can be done in the R'(X, Y, Z) representation or in the R$_{m,m}$(Z) representation.

22) Although all the discussion of this embodiment is in terms of SXR wavelengths of e.g., 10 nm to 20 nm, it is also applicable to other X-ray wavelengths; more generally, all wavelengths for which the refractive index of relevant materials is close to one. It is also applicable to hard-X-ray transmission (small-angle diffraction). In transmission, Eq. E2.2 may be used to translate wavevectors to q-space rather than Eq2.1. In equation E2.3, angle $\theta_1$ may be understood as having a value <90 degrees and $\theta_2$ as having a value >90 degrees. Equation E2.4 requires modification to:

$$q'_z = \tilde{v}\left[-\sqrt{1-\left(\kappa_x^0+\frac{m\lambda}{p_x}\right)^2-\left(\kappa_y^0+\frac{m'\lambda}{p_y}\right)^2}+\sqrt{1-\left(\kappa_x^0\right)^2-\left(\kappa_y^0\right)^2}\right].$$

Detection and Correction of Grating Imbalance for DBO

Another overlay extraction embodiment will now be described, which aims to address the problem of grating imbalance; e.g., where the grating separation is different for the targets with positive and negative bias which induces an overlay error. This is a particular problem when the wavelength is small, e.g. EUV, soft X-ray and/or hard X-ray, as this error may be very large (e.g., an asymmetry error of up to 50% may be observed). This asymmetry error will introduce a significant error into the measured overlay value. The method of this embodiment is related to the embodiment just described.

The method of this embodiment proposes to amend (e.g. shift and/or scale) the asymmetry swing curves (i.e., plots of asymmetry against wavelength for a particular target). One embodiment may comprise amending one or both of respective swing curves from targets having different biases such that they have the same wavelength for a certain asymmetry (e.g., asymmetry is zero).

This concept may be used to measure the grating imbalance between different layers of an overlay target.

One approach for detection of and correction for grating imbalance is to look at the zero crossings in the asymmetry signal as a function of wavelength (swing curve). Some metrology technologies (e.g., SXR metrology) enable measurement of these asymmetries through wavelength in a single acquisition.

Figure 23:
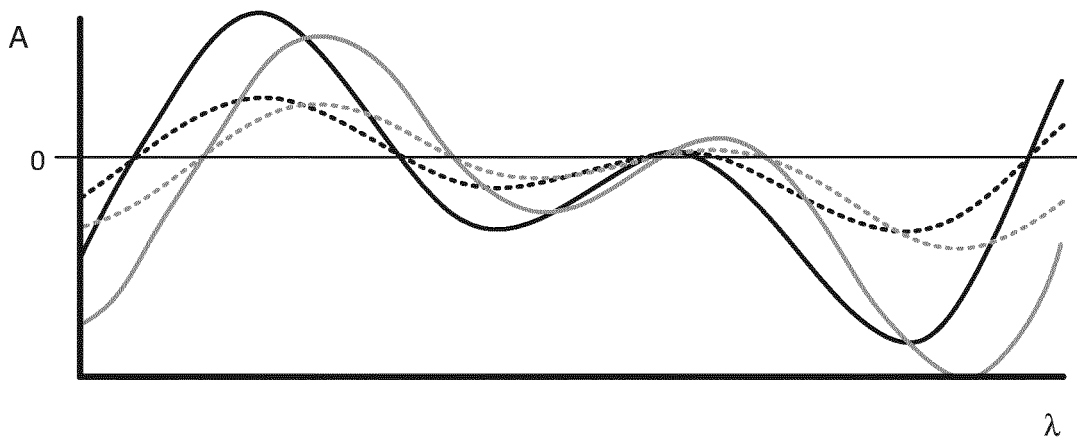
FIG. 23 is a swing curve plot of measured asymmetry against wavelength for targets with variations in overlay and grating imbalance.

FIG. 23 depicts the asymmetry as function of wavelength for two overlay OV values, each with two distinct layer heights H. In this specific illustrative example, the grating pair has layer heights H=95 nm and H=96 nm respectively, e.g., a grating imbalance GI of 1 nm. Note that GI may more properly refer to the combined effect of all differences between the gratings of a grating pair which are not directly related to the overlay. It can be seen that, if the overlay varies but the separation remains constant, the zero crossings overlap (e.g., the zero crossings overlap for the black traces (H=95 nm) and for the gray traces (H=96 nm)). When the grating imbalance changes, the position of the zero crossings shift in wavelength.

The zero crossings of each curve only depend on the grating separation divided by wavelength. When the wave from the bottom grating interferes destructively with the wave from the top grating, a zero crossing occurs. The interference depends on the phase difference between top and bottom waves and thus on optical path difference which scales with grating separation relative to wavelength.

Figure 24:
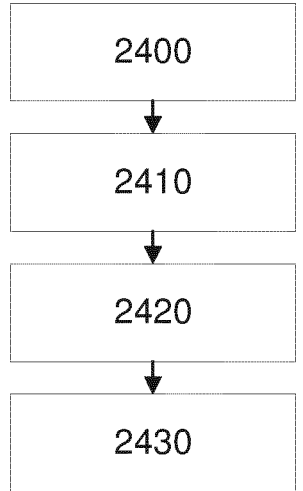
FIG. 24 is a flowchart describing a further method of overlay inference according to an embodiment of the invention.

FIG. 24 is a flowchart describing a method according to such an embodiment. At step 2400, a measurement is performed on a target structure comprising at least two targets with respective different biases, at a number of different illumination settings (e.g., different combinations of one or both of: wavelengths and polarizations). At step 2410 for each biased target, the asymmetric component (the asymmetry signal) is extracted from the diffraction patterns measured at step 2400, and plotted against wavelength (e.g., per polarization if more than one polarization is used) to obtain a respective asymmetrical swing curve. At step 2420, the position of the zero crossings of the asymmetry signals is determined. It is then further determined whether the zero crossing positions overlap for the positive and negative biased targets (i.e., do they have common zero crossing wavelengths). If these swing curves do not have common zero crossing positions, the shift in wavelength between the respective zero crossing position may be used as a metric for grating imbalance. At step 2430, if grating imbalance is detected, a correction for overlay error may be determined. This may be achieved by shifting one asymmetry signal (or both signals) such that the zero crossings of the two asymmetry signals overlap. This will reduce the overlay error significantly.

An improved correction strategy may comprise transforming the asymmetry curves into wavenumber space or other inverse domain. Zero crossings are equidistant in wavenumber space and their spacing depends on the grating separation. Therefore a shift does not completely correct for grating separation. In this embodiment, the wavenumber zero crossings may be linearly mapped from one measurement (relating to one biased target) to the other measurement relating to the other biased target. This may comprise shifting and scaling the wavenumber axis to match all the zero crossings. The transformation in wavenumber space is non-linear.

Besides shifting/scaling in the X axis, there may be many other mathematic methods which may be used to match the zero crossings. For example instead of a linear increasing function, a mapping $v'=f(v)$ or $\lambda'=f(\lambda)$ may be fitted. This function $f$ may be any suitable function, or may be achieved by application of a neural network with multiple layers.

An example of generalize flow may include steps of (1) diffraction pattern measurement; (2) optionally, feature extraction for different wavelengths (typically symmetric or asymmetric components); (3) multi-wavelength transform; (4) optionally, correction to combine multiple targets; (5) mapping on parameter of interest.

In all the above embodiments relating to an inverse space/domain or wavenumber space/domain may include transformation into any related space/domain (e.g., inverse space, wavenumber space, wavelength space etc.).

Overlay Inference Based on Fourier Signal Decomposition

In a further main embodiment, the inference problem (i.e., how to translate a detector signal to a parameter of interest such as overlay) is addressed in a different manner Note that this embodiment may be complementary or alternative to any of the above described embodiments. When complementary, any of the above methods may be used initially, e.g., to filter the measured signal for drift in the drift parameters or infer and correct for layer thickness before inferring the parameter of interest. It has been observed that some known inference methods, such as asymmetry A+/A− plots (i.e., a plot of asymmetry for a positive biased target against asymmetry for a negative biased target) are ineffectual for SXR illumination based metrology devices.

The proposed approach is a partially data-driven approach which also enables incorporation of known physics. The concept of a data-driven approach can be understood to mean training some inference model on a set of detector signals from targets with known parameter value (e.g., known overlay), and then using that trained model to infer a value for the parameter during operation.

The inference model can be defined and applied on a data from, for example, a single die, field or substrate comprising a plurality of targets (e.g., grating-on-grating overlay targets for overlay) with different parameter values (e.g., biases for overlay). The goal is to train a model on a subset of this data relating to a subset of these targets (training set) and then use this model to infer bias on the remaining data/targets (test set). The method may do this by then minimizing the get-set error or similar difference metric which describes the difference (e.g., the 3σ difference) between the inferred bias and the actual programmed bias.

Where most inference methods rely on training only the inverse model (e.g., from detector signal to parameter of interest), the method proposed here trains the forward model (parameter of interest to detector signal), which can then be inverted to perform actual inference. Note that a forward model does not necessarily only depend on the parameter of interest but may also depend on one or more other parameters (as is the case for the specific forward model recited below) An advantage of this is that by defining the basic form of this forward model knowledge of the physics of the target response can be incorporated. A general disadvantage of pure data-driven methods is that they do not give insight into and do not take advantage of the physical properties of the system.

The model may comprise three terms:

a constant term, which is the response which would be resultant from measurement of a zero-value parameter (e.g., zero-overlay) target, with all other parameters that vary between targets at their average value, a parameter of interest term (e.g. overlay term) which describes the (e.g., periodic) response to of the detector signal to the parameter of interest (e.g., overlay or bias); and one or more nuisance terms which each describes any other variations between target measurements.

In an embodiment, the one or more nuisance terms may be obtained via a Singular Value Decomposition (SVD), with each term comprising a single value or SVD component.

In an embodiment, the overlay term may be decomposed into harmonics, e.g., using a Fourier decomposition. This is particularly relevant for periodic targets used for example, in measurement of overlay, such that the parameter of interest term describes the periodic response to of the detector signal.

The Equation below describes an exemplary forward model according to an embodiment:

$$S_{ij}(b, q) = K_j + \sum_{k=1}^{\#harm} \left( L_{kj} \sin\left(\frac{2\pi k}{p} b_i\right) + M_{kj} \cos\left(\frac{2\pi k}{p} b_i\right) \right) + \sum_{k=1}^{\#SVD} P_{kj} q_{ki},$$

where:

$S_{ij}(b, q)$ is the detector signal for target i, with the subscript j referring to a specific pixel on the camera. This is what the model is aiming to predict.

The first term $K_j$, is the constant term representing the constant component of the camera signal;

The second term is the parameter of interest term or overlay term. This example is specific for periodic response where the target is periodic, with p being the pitch of the target. In terms of overlay, $b_i$ is the overlay (more specifically, for training, an imposed bias or imposed overlay) of the target in question, and $L_{kj}$ and $M_{kj}$ describe the kth harmonic of the overlay response. The model contains #harm such harmonics; observations have shown #harm between 2 and 6, between 3 and 5 or #harm=4 may be optimal. This term is readily adaptable by the skilled person to other parameters of interest, whether measured on a periodic target or otherwise.

The third term is the nuisance term which describes any other variations between target measurements, such as stack properties other than overlay or tool parameters such as alignment. The model contains #SVD such variations, where each variation comprises an SVD component; observations have shown #SVD between 10 and 30, between 10 and 20, between 15 and 20 or #SVD=17 may be optimal. The kth variation is described by a variation of the detector signal $P_{kj}$ weighted per target i with weight $q_{kj}$.

The equation with i subscript (target index) represents an application of the equation to a specific target; a generic form of the equation may omit the i subscript.

Relating this to the previous embodiment, k is analogous to m in the previous embodiment and j, referring to detector pixels, is analogous to the pupil coordinate $K_x$ in the previous embodiment. The matrices K, L, M are closely related to $\hat{R}_m(q'_z)$ in the previous embodiment, since a combination m, $q'_z$ can be mapped straightforwardly to a pixel number or pupil $\kappa_x$ coordinate; $K_j$ is related to $\hat{R}_0(q'_z)$. Here, $\hat{R}_m(q'_z)$ may be interpreted as the Fourier component related to R'(X, $Z_o$) where $Z_o$ is the Z-value related to overlay. The summation $P_{kj} q_{ki}$ captures variation other target properties such as grating asymmetry.

To train the model, the detector signal term $S_{ij}$ relates to a training set of signals for targets with known biases $b_i$. This training set of signals is used to fit (e.g., in a least-squares sense) parameters $K_j$, $L_{kj}$, $M_{kj}$, $P_{kj}$, and $q_{ki}$ on this data. This may be done, for example, by dividing the training data randomly into multiple subsets, and then training each subset on the other subsets in turn. This trains the forward model, e.g., fixing $K_j$, $L_{kj}$, $M_{kj}$, $P_{kj}$.

Note that optionally one or more processing operations may be performed on the training set $S_{ij}$. The processing may, purely for example (other pre-processing methods may be employed), comprise one or more of the following steps:

Integrate camera signal over columns (e.g., determine column-wise integrated sum (CWIS));

Concatenate first orders of (averaged) nominal and rotated orientation, therefore four 'orders' in total. Note that there is no asymmetry calculation;

Normalize signal for each target based on total intensity in the four orders

Remove outliers (which may be identified, for example based on either SVD weights or final residuals);

Smooth the signal with a Gaussian smoothing function. The convolution width σ may be, for example, between 0.5 and 2.5 pixels, between 0.75 and 1.75 pixels, between 1 and 1.5 pixels or approximately σ=1.2 pixels. Note that, as an alternative to Gaussian smoothing, a Fourier domain low pass filter may be used to reduce the (already low) impact of shot noise.

Note that one or more of the number of harmonics #harm, number of SVD components #SVD and convolution width σ may be treated as hyperparameters to be fixed in a hyperparameter optimization prior to the main training of the model.

Note that, as an alternative to Gaussian smoothing, a Fourier domain low pass filter may be used to reduce the (already low) impact of shot noise. Leveling errors in X may be corrected by shifting the signal. This is may be implemented, for example, by adding a shift to the inference model (or rather three shifts, one for each of the three measurements). This requires the possibility to apply sub-pixel shifts to the data, which is trivial if the above low pass filter is implemented.

For the nuisance term, the actual SVD may be performed on a data matrix of detector column index v. image i. Again, a preprocessing may be applied, comprising one or more of: calculating column-wise integrated sum (CWIS) of intensity for the nominal and rotated image; normalize by total intensity in order and subtract nominal CWIS from rotated CWIS; e.g., subtract left from right asymmetry for sensor correction.

For inference, the detector signal term $S_o$ relates to the image(s) being processed to determine the parameter of interest, and parameters $K_j$, $L_{kj}$, $M_{kj}$, $P_{kj}$ are fixed to the values learned in training. The value for the parameter of interest (e.g., overlay) $b_i$ (note that this overlay value will be a combination of overlay and intentional bias if the target is intentionally biased) and SVD weight $q_{ki}$ for each target are then fitted (e.g., again in a least-squares sense).

This method enables the training a physics-based forward model, as opposed to directly training the reverse (inference) model. For example, a regularization may be added to impose physical constraints. By way of a specific example, the knowledge that only low-frequency X content contains overlay information (which is addressed in the above by the CWIS and smoothing steps). This may be better addressed by describing it in the actual inference model through regularization. Similarly hard cutoffs for number of harmonics and SVD components may be better implemented through regularization.

Another advantage of this approach is that it uses the full signal as opposed to only the asymmetric part (as is done for example in the standard A+/A− analysis).

Each of the above-mentioned embodiments may be applied to eliminate, remove, suppress or correct the impact of one or more nuisance parameters, for example angle of incidence or grating imbalance. Each of the above-mentioned embodiments may also be applied to infer a parameter of interest, for example overlay and layer thickness, or a nuisance parameter, for example grating height imbalance.

The impact of nuisance parameters may need to be eliminated from the measured data of metrology measurement in order to get accurate measurement results of a lithographic processing parameters e.g. overlay, structure dimension, structure optical properties, critical dimension or focus. The nuisance parameters may comprise one or more of incident angel variation, thickness drift or grating height drift (may also be called separation difference or grating imbalance), and structure asymmetry.

Some of the embodiments give much more than just a method to correct measurement errors but can also measure value of the nuisance parameter. Multiple embodiments may also be combined and implemented to one measurement data simultaneously or subsequently.

Optionally the above-mentioned embodiments are data-driven method or model training Optionally many of the above-mentioned embodiments may comprise non-iterative methods which are different from ptychography and other forms of coherent diffraction imaging (CDI). The above-mentioned embodiments are also different from crystallography, which is typically used as forward model.

The above-mentioned embodiments may be "error correction" (that is to eliminate impact of nuisance parameters on e.g. overlay) or "feature extraction", which may be different from "reconstruction" e.g., which may comprise involving a rigorous forward model such as Rigorous Coupled Wave Analysis (RCWA) and non-linear regression. One of the advantages is that a rigorous forward model is not needed.

Further embodiments are disclosed in the subsequent numbered clauses:

1. A method of metrology comprising:
   obtaining measurement data relating to at least one measurement of each of one or more structures on a substrate; the measurement data being dependent upon one or more drift parameters, said drift parameters comprising at least one interdependent drift parameter for which each measurement is dependent on a structure response metric which varies with an illumination setting and said at least one interdependent drift parameter interdependently; and
   correcting the measurement data based on an approximately invariant transformation of said structure response metric or related metric.

2. A method as claimed in clause 1, wherein the illumination setting comprises one or more wavelengths of measurement illumination used to obtain said measurement data.

3. A method as claimed in clause 2, wherein measurement illumination comprises one or more wavelengths in the range of 0.01 nm to 20 nm.

4. A method as claimed in clause 2 or 3, wherein the at least one interdependent drift parameter comprises an angle of incidence of the measurement illumination on said structure.

5. A method as claimed in clause 4, wherein the angle of incidence has a nominal value between 20 and 90 degrees.

6. A method as claimed in any preceding clause, wherein the at least one interdependent drift parameter comprises a total thickness of one or more layers on said substrate.

7. A method as claimed in any preceding clause, wherein the approximately invariant transformation of said structure response metric describes a set of pairs of the at least one interdependent drift parameter and said illumination setting which each having an approximately common value for the structure response metric.

8. A method as claimed in any preceding clause, wherein the transformation comprises transforming a first value of the interdependent parameter to a second value of the interdependent parameter and scaling a first value of the illumination setting to obtain a second value for the illumination setting; the scaling comprising a ratio of the second value of the interdependent parameter or a trigonometric function thereof and the first value of the interdependent parameter or a trigonometric function thereof.

9. A method as claimed in any preceding clause, wherein the structure comprises a grating structure and the structure response metric comprises a diffraction efficiency metric for the structure.

10. A method as claimed in any preceding clause, wherein said step of correcting the measurement data comprises:
   determining one or more partial derivatives for said measurement data, each partial derivative describing a variation in the measurements in terms of each of said one or more drift parameters, wherein the determining of the partial derivative for said at least one interdependent drift parameter comprises determining the partial derivative of the approximately invariant transformation of said structure response metric or related metric; and
   correcting the measurement data based on the one or more partial derivatives to obtain said corrected measurement data.

11. A method as claimed in clause 10, comprising the initial step of determining difference data describing differences in each of said measurements with respect to a reference measurement value; said measurement data comprising said difference data and said reference measurement value.

12. A method as claimed in clause 11, wherein the reference measurement value comprises an average of said measurements.

13. A method as claimed in clause 11 or 12, comprising determining corrected measurement data by performing a minimization of the difference data and said partial derivatives in terms of coefficients therefor, the corrected measurement data having had a component subtracted which the minimization estimates to be related to drift in said one or more drift parameters.

14. A method as claimed in any of clauses 10 to 13, wherein said measurements each comprise an image captured by a detector at a detector plane.

15. A method as claimed in clause 14, wherein said method comprises mapping the measurement data from an image plane representation to a pupil plane representation.

16. A method as claimed in clause 14 or 15, wherein the drift parameters further comprise one or more parameters relating to the detector position.

17. A method as claimed in clause 16, wherein determining a partial derivative for one or more parameters relating to the detector position comprising performing for each of a first direction and second direction of the image plane, the step of:

determining for each pixel of each image, a difference between a measured value for adjacent pixels on either side of that pixel in the respective direction divided by twice the pixel size in that direction.

18. A method as claimed in clause 16 or 17, wherein determining a partial derivative for one or more parameters relating to detector position comprises:

mapping the measurement data from an original image plane representation to a pupil plane representation;

imposing a perturbation to the pupil plane representation;

transforming back the perturbed pupil plane representation to a perturbed image plane representation; and determining the partial derivative as a difference between perturbed image plane representation and original image plane representation divided by the perturbation.

19. A method as claimed in any of clauses 10 to 18, wherein the drift parameters further comprise an azimuth angle.

20. A method as claimed in any of clauses 10 to 19, wherein the drift parameters further comprise one or both of the illumination power and illumination beam divergence.

21. A method as claimed in clause 20, wherein a partial derivative of illumination beam divergence is estimated by convolving each measurement in pupil space with a convolution kernel and subtracting the original measurement from the convolution.

22. A method as claimed in clause or 21, wherein a partial derivative of illumination power is estimated by dividing the measurements by the nominal source power.

23. A method as claimed in any preceding clause, wherein said one or more structures comprise a plurality of similar structures.

24. A method as claimed in any preceding clause, wherein the drift parameters further comprise the azimuth angle.

25. A method as claimed in any preceding clause, further comprising:

obtaining a trained forward model describing a measured signal in terms of at least one parameter of interest term describing the response to the parameter of interest of a target, one or more nuisance terms describing other variations between measurements of the target and a constant term representing a constant component of the corrected measurement data; and inferring a value for the parameter of interest from said corrected measurement data using said trained forward model.

26. A method as claimed in clause 25, wherein said inferring step comprises fitting the parameter of interest and a weighting for each of the one or more nuisance terms to the corrected measurement data on the trained forward model.

27. A method as claimed in clause 25 or 26, wherein the one or more nuisance terms are determined from a singular value decomposition.

28. A method as claimed in clause 27, comprising a plurality of nuisance terms, each relating to a separate singular value decomposition component.

29. A method as claimed in clause 28, comprising a step of optimizing the number of singular value decomposition components as a hyperparameter in an optimization phase.

30. A method as claimed in any of clauses 25 to 29, wherein said response to the parameter of interest of a target is described by a Fourier series.

31. A method as claimed in clause 30, wherein the at least one parameter of interest term comprises a plurality of parameter of interest terms, each relating to a separate harmonic as a result of a Fourier decomposition.

32. A method as claimed in clause 31, comprising a step of optimizing the number of harmonics as a hyperparameter in a training phase.

33. A method as claimed in any of clauses 25 to 32, comprising training the model on training data with known values for the parameter of interest in a training phase.

34. A method as claimed in any of clauses 25 to 33, wherein the parameter of interest is overlay.

35. A method as claimed in any of clauses 25 to 34, comprising applying a regularization to the model to constrain the result based on known physics.

36. A method of inferring a value for a parameter of interest from said measurement data, comprising:

obtaining said measurement data, said measurement data relating to scattered radiation from a target captured on a detector;

obtaining a trained forward model describing a measured signal in terms of at least one parameter of interest term describing the response to the parameter of interest of a target, one or more nuisance terms describing other variations between measurements of the target and a constant term representing a constant component of the measurement data; and inferring the value for the parameter of interest from said measurement data using said trained forward model.

37. A method as claimed in clause 36, wherein said inferring step comprises fitting the parameter of interest and a weighting for each of the one or more nuisance terms to the measurement data on the trained forward model.

38. A method as claimed in clause 36 or 37, wherein the one or more nuisance terms are determined from a singular value decomposition.

39. A method as claimed in clause 38, comprising a plurality of nuisance terms, each relating to a separate singular value decomposition component.

40. A method as claimed in clause 39, comprising a step of optimizing the number of singular value decomposition components as a hyperparameter in an optimization phase.

41. A method as claimed in any of clauses 36 to 40, wherein the at least one parameter of interest term comprises a plurality of parameter of interest terms, each relating to a separate harmonic as a result of a Fourier decomposition.

42. A method as claimed in clause 41, comprising a step of optimizing the number of harmonics as a hyperparameter in a training phase.

43. A method as claimed in any of clauses 36 to 42, comprising training the model on training data with known values for the parameter of interest in a training phase.

44. A method as claimed in any of clauses 36 to 43, wherein the parameter of interest is overlay.

45. A method as claimed in any of clauses 36 to 44, comprising applying a regularization to the model to constrain the result based on known physics.

46. A method of metrology comprising:

obtaining measurement data relating to at least one measurement of each of one or more structures on a substrate;

transforming the measurement data into a reciprocal space to obtain reciprocal measurement data;

Further transforming said reciprocal measurement data to obtain transformed measurement data; and inferring a profile parameter value relating to the substrate from the transformed measurement data.

47. A method of metrology as claimed in clause 46 wherein said further transforming step comprises Fourier transforming.

48. A method of metrology as claimed in clause 46 or 47, wherein the step of inferring a profile parameter value comprises determining the position of a peak value in the further transformed measurement data, and inferring the profile parameter value from the position of the peak value.

49. A method of metrology as claimed in any of clauses 46 to 48, wherein the step of transforming the measurement data into a reciprocal space comprises one of:

transforming the measurement data such that it is represented in terms of inverse coordinates in inverse space;

transforming the measurement data such that it is represented in terms of wavenumber in a wavenumber space;

transforming the measurement data such that it is represented in terms of wavelength in a wavelength space; or transforming the measurement data such that it is represented in terms of momentum transfer in a momentum transfer space.

50. A method of metrology as claimed in any of clauses 46 to 49, wherein said measurement data comprises datasets relating to corresponding measurements for which the only difference in the datasets is assumed to be due to variation in the profile parameter; and said method comprises taking the derivative of this measurement data over the corresponding measurements prior to said transformation steps.

51. A method of metrology as claimed in clause 50, wherein said measurement data relates to measurements of the same one or more structures covering a time period over which the profile parameter value is expected to vary to obtain time dependent measurement data; and said method comprises:

performing said transforming steps on said time dependent measurement data.

52. A method of metrology as claimed in clause 51, comprising processing said time dependent measurement data to obtain continuous time dependent measurement data prior to said transformation steps.

53. A method of metrology as claimed in clause 52, wherein said method comprises determining a variation in the profile parameter value over time.

54. A method of metrology as claimed any of clauses 51 to 53, wherein said measurement data relates to measurements of at least two identical structures other than a variation in said profile parameter between said structures.

55. A method of metrology as claimed in clause 54, wherein the profile parameter value relates to at least one of said at least two identical structures.

56. A method of metrology as claimed in clause 54 or 55 wherein said at least two identical structures comprise a first structure having a first bias, a second structure having a second bias and a third structure, being substantially identical to said first structure other than in terms of said profile parameter;

determining an overlay value from measurement data from the first structure and second structure;

performing at least said transforming and inferring steps on measurement data relating to the first structure and third structure to determine a profile parameter value for the first structure and second structure; and correcting the overlay value for a difference in profile parameter value between the first structure and second structure.

57. A method of metrology as claimed any of clauses 49 to 56, wherein the profile parameter relates to a layer thickness of a resist layer on the substrate.

58. A method of metrology as claimed any of clauses 49 to 57, comprising determining a value for a parameter of interest corrected for said profile parameter or any variation in said profile parameter.

59. A method of metrology as claimed any of clauses 49 to 58, to obtain measurement data and corresponding values for said profile parameter; and performing the method of clause 43 using said measurement data as said training data.

60. A method of metrology as claimed any of clauses 46 to 49, wherein said measurement data comprises at least asymmetry component data describing asymmetry in said one or more structure; and optionally, said step of further transforming is performed to obtain a complex-valued spectrum for each structure in distance space.

61. A method of metrology as claimed in clause 60, wherein said structure comprises a target structure comprising at least a first grating in a first layer and a second grating in a second layer.

62. A method of metrology as claimed in clause 61, wherein the method further comprises determining a path-length difference between first radiation scattered by the first layer and second radiation scattered by the second layer.

63. A method of metrology as claimed in clause 62, wherein said profile parameter is overlay and said path-length difference is related to overlay.

64. A method of metrology as claimed in clause 62 or 63, comprising:

determining scalar asymmetry values from said path length difference; and determining the profile parameter from said scalar asymmetry values.

65. A method of metrology as claimed in clause 64, comprising using an estimate of a fixed phase difference between said first radiation and second radiation to convert the scalar asymmetry values to real asymmetry values.

66. A method of metrology as claimed in clause 64 or 65, wherein said determining scalar asymmetry values is achieved by integrating a peak in the respective distance spectrum.

67. A method of metrology as claimed in clause 62 or 63, comprising:

applying a bandpass filter around said path length difference in the respective distance spectrum; and transforming back to said reciprocal space.

68. A method of metrology as claimed in any of clauses 62 to 67, comprising performing one or more of:

applying a correction to the asymmetry component data or scalar asymmetry values to account for the illumination spectrum and/or the response spectrum of a detector used to detect said first radiation and second radiation;

applying a correction for refractive index of the medium or media between said first layer and second layer;

filtering out of an undesired part of the asymmetry component data using a window function.

69. A method as claimed in clause 62, wherein said profile parameter value comprises a distance between said first grating and second grating.

70. A method as claimed in clause 69, wherein the method accounts for the wavelength or wavenumber dependent refractive index functions of said first layer, said second layer and any intervening layer(s) and diffraction angles through the layers of diffracted radiation from which said measurement data relates to obtain said distance between said first grating and second grating.

71. A method as claimed in clause 70, wherein said measurement data further comprises symmetry component data describing symmetry in said one or more structure.

72. A method as claimed in clause 69 or 70, wherein said transformation into a reciprocal space comprises determining a wavelength or wavenumber dependent function describing the diffraction through said layers; and
  modifying the refractive index functions such that the product of the refractive index functions and wavelength or wavenumber dependent function can be inverted to find the wavenumber in terms of a function of said product over a wavenumber range of interest.

73. A method of metrology as claimed in any of clauses 46 to 49, comprising determining a reconstruction signal in real space from the transformed measurement data; and
  determining at least one said profile parameter from said reconstruction signal.

74. A method of metrology as claimed in clause 73, wherein at least one said profile parameter comprises one or more positional and/or size parameters of said one or more structures.

75. A method of metrology as claimed in clause 73, wherein said one or more positional and/or size parameters comprise one or both of overlay or critical dimension.

76. A method of metrology as claimed in clause 73 or 75, wherein said one or more positional and/or size parameters comprise edge placement and/or edge placement error.

77. A method of metrology as claimed in any of clauses 73 to 76, wherein said reciprocal space is a momentum transfer space, such that said transformed measurement data is described in terms of momentum transfer.

78. A method of metrology as claimed in clause 77, comprising mapping said measurement data to said momentum transfer space from another reciprocal space.

79. A method of metrology as claimed in clause 78, wherein said other reciprocal space comprises a wavenumber or wavelength space.

80. A method of metrology as claimed in any of clauses 73 to 79, wherein said measurement data comprises diffraction efficiencies or diffraction intensities or relates to any amplitude metric for a plurality of diffraction orders.

81. A method of metrology as claimed in any of clauses 73 to 80, wherein said reconstruction signal comprises an autocorrelation of amplitude in said real space.

82. A method of metrology as claimed in any of clauses 73 to 81, wherein said reconstruction signal comprises regions of higher amplitude; and
  said step of determining one or more positional and/or size parameters comprises determining these parameters from the size and/or position and/or a configuration of a corresponding one or more of said regions of higher amplitude.

83. A method of metrology as claimed in clause 82, wherein at least some of said regions of higher amplitude correspond to a different one of said one or more positional and/or size parameters.

84. A method of metrology as claimed in clause 82 or 83, wherein the position of said regions of higher amplitude corresponding to a first direction, which corresponds to a direction perpendicular to a substrate plane, in said real space is indicative of one or more of said positional and/or size parameters in said first direction.

85. A method of metrology as claimed in clause 84, wherein said one or more of said positional and/or size parameters in said first direction comprise one or more of:
  one or more heights of said one or more structures; and/or
  one or more distances between said one or more structures and/or features thereof.

86. A method of metrology as claimed in any of clauses 82 to 85, wherein the size and/or position and/or a configuration of said regions of higher amplitude corresponding to a second and/or third direction parallel to a substrate plane is indicative of one or more of said positional and/or size parameters in said second and/or third direction.

87. A method of metrology as claimed in clause 86, wherein said one or more of said positional and/or size parameters in said second and/or third direction comprise one or more of:
  a width, critical dimension or any other dimension of one or more of said one or more structures;
  a difference in widths, critical dimensions or any other dimensions of at least two of said one or more structures and/or features of the same structure;
  an overlay or offset between at least two of said one or more structures; and/or
  a structural asymmetry in one or more of said one or more structures.

88. A method of metrology as claimed in clause 86 or 87, wherein the size and/or position and/or a configuration of said regions in a second and/or third direction parallel to a substrate plane which is indicative of one or more of said positional and/or size parameters in said second and/or third direction comprises one or more of:
  an offset of one or more of said regions with respect to an origin;
  a width of one or more of said regions; and/or
  a dimension of a flat region of a contour of one or more of said regions.

89. A method of metrology as claimed in clause 87 or 88, wherein said one or more structures comprises two cross-correlated structures each having a first pitch, the method comprising determining a width or critical dimension of one or both of said two cross-correlated structures according to:
  the width or critical dimension of one or more of said regions corresponds to the width or critical dimension of the larger of said two cross-correlated structures if the sum of the widths of the two cross-correlated structures is less than or equal to said first pitch; and
  the width or critical dimension of one or more of said regions will correspond to a difference of said first pitch and the width or critical dimension of the smaller of said two cross-correlated structures if the sum of the widths of the two cross-correlated structures is greater than or equal to said first pitch.

90. A method of metrology as claimed in any of clauses 87 to 89, wherein said width or critical dimension of one or more of said regions are determined as a full width half maximum value at the mid-point between the highest and lowest value of a respective region of higher amplitude and/or a respective real-valued cross-correlation function for said region.

91. A method of metrology as claimed in any of clauses 82 to 91, wherein said one or more structures comprise a combination target comprising two or more biased targets and the method comprises: determining at least one of said regions of higher amplitude as a region associated with overlay relating to said combination target and an associated value in said real space;

determining a respective position value in said real space for each bias value based on said region associated with overlay; and determining an overlay value from said respective position values.

92. A method of metrology as claimed in clause 91, wherein the combination target is subject to a grating imbalance such that there is a respective different said region associated with overlay and respective associated value in said real space for at least two of said two or more biased targets; and the method comprises determining each respective position value from its respective associated value.

93. A method of metrology as claimed in any of clauses 82 to 92, comprising determining a calibration to calibrate the reconstruction signal; the calibration comprising:

creating a plurality of targets with a process parameter varied, such that critical dimension also varies per target;

determining reconstruction signals per target and corresponding cross-correlation functions;

identify a target for which a region of said reconstruction signal associated with critical dimension is zero or close to zero for a complementary pair of even-numbered diffraction orders;

determine a threshold value such that a part of the cross-correlation function corresponding to said target and said region of the reconstruction signal which is above the threshold has a width equal to half of the target pitch; and using said threshold to assign critical dimension values to one or more of the other cross-correlation functions.

94. A method of metrology as claimed in any of clauses 82 to 93, comprising:

identifying at least one of said regions of higher amplitude in real space as a region associated with a critical dimension of said one or more structures; and determining said critical dimension from a ratio of a first value of said reconstruction signal corresponding to said region associated with a critical dimension corresponding to a first higher diffraction order and a second value of said reconstruction signal corresponding to said region associated with critical dimension corresponding to a second higher diffraction order of different diffraction order number.

95. A method of metrology as claimed in any of clauses 73 to 94, wherein the step of further transforming is performed on an optimized region in said reciprocal space; wherein the optimized region is optimized for one or more of:

no missing data in the optimized region;

a contiguous range of diffraction orders is covered by said optimized region for each value in said reciprocal space; and only combinations that can be extracted unambiguously are covered.

96. A method of metrology as claimed in any of clauses 73 to 95, comprising constructing a full reconstruction of said one or more structures in one, two, or three dimensions from said reconstruction signal.

97. A method of metrology as claimed in any of clauses 73 to 96, comprising applying a correction for the actual refractive index of the one or more structures and/or associated layers.

98. A method of metrology as claimed in any of clauses 73 to 97, wherein the reconstruction signal comprises a combination of results from multiple measurements using different illumination spectra on the same one or more structures.

99. A method of metrology as claimed in any of clauses 73 to 98, wherein the measurement data relates to at least three diffraction orders.

100. A method of metrology as claimed in any of clauses 73 to 99, wherein the measurement data relates to at least a pair of complementary higher orders and a zero order; or two pairs of complementary higher orders.

101. A method of metrology as claimed in any of clauses 73 to 98, wherein the measurement data relates to only a pair of complementary higher orders, and the method comprises:

determining a complex-valued pair of said reconstruction signal in terms of a first direction perpendicular to a substrate plane, each relating to a respective one of the pair of complementary higher orders; and estimating a position of said one or more structures in a second or third direction parallel to a substrate plane from said complex valued pair.

102. A method of metrology as claimed in clause 101, wherein said estimating step is based on extracting a phase difference between a first reconstruction signal of said complex valued pair and a second reconstruction signal of said complex valued pair.

103. A method of metrology as claimed in any of clauses 73 to 102, comprising applying a phase-gradient correction to the reconstruction signal.

104. A method of metrology as claimed in any of clauses 73 to 103, comprising splitting said measurement data into symmetric and asymmetric components and treating each separately.

105. A method of metrology as claimed in any of clauses 73 to 104, comprising using said reconstruction signal represented in real space; and/or features thereof as an input for a model and training said model on reference data, such that the trained model is able to correct for any assumptions used in generating the reconstruction signal.

106. A method of metrology as claimed clause 105, comprising using the trained model to correct for any assumptions used in generating the reconstruction signal.

107. A method of metrology comprising:

obtaining, using a plurality of measurement settings, first measurement data relating to measurement of a first structure on a substrate and second measurement data relating to measurement of a second structure on the substrate said first structure and second structure having a difference in an imposed bias between them;

determining a first relationship between said first measurement data and said measurement setting and a second relationship between said second measurement data and said measurement setting;

correcting said first measurement data and/or second measurement data to amend the first relationship with respect to the second relationship such that they have a common measurement setting for a particular measurement value; and inferring a profile parameter value based on the corrected first measurement data and/or second measurement data.

108. A method of metrology as claimed in clause 107, wherein the correcting step comprises applying a mapping function or model which amends the first relationship with respect to the second relationship such that they have a common measurement setting for a particular measurement value.

109. A method of metrology as claimed in clause 108, comprising transforming the first and second measurement data into a wavenumber or wavelength space to obtain inversed first measurement data and inversed second measurement data; and wherein said applying a mapping function or model is performed on said inversed first measurement data and inversed second measurement data in said wavenumber or wavelength space.

110. A method of metrology as claimed in clause 107, 108 or 109, wherein the measurement data comprises measured asymmetry data and said particular measurement value is zero asymmetry.

111. A method of metrology as claimed in any of clauses 107 to 110, wherein said correcting step comprises shifting and/or scaling one of said first relationship with respect to said other relationship.

112. A method of metrology as claimed in any of clauses 107 to 111, wherein said profile parameter is overlay.

113. A method of metrology as claimed in any of clauses 107 to 112, wherein said measurement setting is wavelength of measurement illumination.

114. A method of metrology as claimed in any of clauses 107 to 113, comprising determining a measure of any grating imbalance between the first structure and second structure from a magnitude of the difference in said measurement setting for said particular measurement value prior to said correction step.

115. A method of metrology as claimed any of clauses 46 to 114, comprising illuminating a target with EUV, soft X-ray or hard X-ray illumination.

116. A method as claimed in any preceding clause, comprising performing said measurements to obtain said measurement data.

117. A computer program comprising computer readable instruction operable to perform at least the processing and determining a position steps of the method of any of clauses 1 to 106.

118. A processor and associated storage medium, said storage medium comprising the computer program of clause 117 such that said processor is operable to perform the method of any of clauses 1 to 106.

119. A metrology device comprising the processor and associated storage medium of clause 118 so as to be operable to perform the method of any of clauses 1 to 116.

120. The metrology device of clause 119, operable to determine a parameter of interest from the corrected measurement data.

121. The metrology device of clause 120, wherein the parameter of interest comprises on or more of overlay, critical dimension, focus, edge placement error on a substrate having been subject to a lithographic process.

122. The metrology device of clause 120, wherein the parameter of interest comprises a position of the structure.

123. A lithographic apparatus arrangement comprising the metrology device of any of clauses 119 to 122.

124. A lithographic cell operable to perform the method of any of clauses 1 to 116.

125. A metrology device operable to perform the method of any of clauses 1 to 116.

Further embodiments are disclosed in the subsequent numbered clauses:

1. A method of metrology comprising: illuminating a radiation onto a substrate; obtaining a measurement data relating to at least one measurement of each of one or more structures on the substrate; using a Fourier-related transform to transform the measurement data into a transformed measurement data; and extracting a feature of the substrate from the transformed measurement data or eliminating an impact of a nuisance parameter.

2. A method of metrology according to clause 1, wherein the one or more structures are projected on the substrate by a lithographic apparatus.

3. A method of metrology according to clause 1 or 2, wherein the using a Fourier-related transform to transform the measurement data into transformed measurement data comprises transforming the measurement data from a reciprocal space to a real space.

4. A method of metrology according to any preceding clause, wherein the transforming the measurement data to frequency domain comprises a Fourier transform.

5. A method of metrology according to any preceding clause, wherein the method comprises a data-driven step or training a model.

6. A method of metrology according to any of clauses 1 to 4, wherein the method is a non-iterative method.

7. A method of metrology according to any preceding clause, wherein the method excludes a rigorous forward model.

8. A method of metrology according to any preceding clause, wherein the step of extracting a feature of the substrate from the transformed measurement data comprises determining a position of a peak value in the transformed measurement data and extracting a feature of the substrate from the position of the peak value.

9. A method of metrology according to any preceding clause, wherein the measurement data relates to measurements of the same one or more structures covering a time period over which the feature is expected to vary to obtain a time dependent measurement data; and the method comprises:
   performing the Fourier-related transform step on the time dependent measurement data, wherein,
   optionally, the method comprises determining a variation in the feature over time.

10. A method of metrology according to any preceding clause, wherein the Fourier-related transform step is performed multiple times.

11. A method of metrology according to any preceding clause, wherein the measurement data comprises at least an asymmetry component of the measurement data describing an asymmetry in the one or more structure.

12. A method of metrology according to any preceding clause, wherein the Fourier-related transform is performed to obtain a complex-valued spectrum for the one or more structures in distance space.

13. A method of metrology according to any preceding clause, wherein the one or more structures comprises a target structure comprising at least a first grating in a first layer and a second grating in a second layer.

14. A method of metrology according to clause 13, wherein the feature of the substrate comprises a distance between the first grating and the second grating.

15. A method of metrology according to any preceding clause, wherein the measurement data further comprises symmetry component data describing symmetry in the one or more structure.

16. A method of metrology according to any preceding clause, comprising determining a reconstruction signal in real space from the transformed measurement data; and
   determining one or more positional and/or size parameters of the one or more structures from the reconstruction signal.

17. A method of metrology according to clause 16, wherein the one or more positional and/or size parameters comprise one or both of overlay or critical dimension.

18. A method of metrology according to clause 16 or 17, wherein the one or more positional and/or size parameters comprise edge placement and/or edge placement error.

19. A method of metrology according to any of clauses 16 to 18, wherein the reconstruction signal comprises an auto-correlation of amplitude in the real space.

20. A method of metrology according to any of clauses 16 to 19, wherein the reconstruction signal comprises regions of higher amplitude; and the step of determining one or more positional and/or size parameters comprises determining these parameters from the size and/or position and/or a configuration of a corresponding one or more of the regions of higher amplitude.

21. A method of metrology according to clause 20, wherein at least some of the regions of higher amplitude correspond to a different one of the one or more positional and/or size parameters.

22. A method of metrology according to clause 20 or 21, wherein the position of the regions of higher amplitude corresponding to a first direction, which corresponds to a direction perpendicular to a substrate plane, in the real space is indicative of one or more of the positional and/or size parameters in the first direction.

23. A method of metrology according to clause 22, wherein the one or more of the positional and/or size parameters in the first direction comprise one or more of:

one or more heights of the one or more structures; and/or one or more distances between the one or more structures and/or features thereof.

24. A method of metrology according to any of clauses 20 to 23, wherein the size and/or position and/or a configuration of the regions of higher amplitude corresponding to a second and/or third direction parallel to a substrate plane is indicative of one or more of the positional and/or size parameters in the second and/or third direction.

25. A method of metrology according to clause 24, wherein the one or more of the positional and/or size parameters in the second and/or third direction comprise one or more of:

a width, critical dimension or any other dimension of one or more of the one or more structures;

a difference in widths, critical dimensions or any other dimensions of at least two of the one or more structures and/or features of the same structure;

an overlay or offset between at least two of the one or more structures; and/or a structural asymmetry in one or more of the one or more structures.

26. A method of metrology according to clause 24 or 25, wherein the size and/or position and/or a configuration of the regions in a second and/or third direction parallel to a substrate plane which is indicative of one or more of the positional and/or size parameters in the second and/or third direction comprises one or more of:

an offset of one or more of the regions with respect to an origin;

a width of one or more of the regions; and/or a dimension of a flat region of a contour of one or more of the regions.

27. A method of metrology according to clause 25 or 26, wherein the one or more structures comprises two cross-correlated structures each having a first pitch, the method comprising determining a width or critical dimension of one or both of the two cross-correlated structures according to:

the width or critical dimension of one or more of the regions corresponds to the width or critical dimension of the larger of the two cross-correlated structures if the sum of the widths of the two cross-correlated structures is less than or equal to the first pitch; and the width or critical dimension of one or more of the regions will correspond to a difference of the first pitch and the width or critical dimension of the smaller of the two cross-correlated structures if the sum of the widths of the two cross-correlated structures is greater than or equal to the first pitch.

28. A method of metrology according to any of clauses 25 to 27, wherein the width or critical dimension of one or more of the regions are determined as a full width half maximum value at the mid-point between the highest and lowest value of a respective region of higher amplitude and/or a respective real-valued cross-correlation function for the region.

29. A method of metrology according to any of clauses 20 to 28, wherein the one or more structures comprise a combination target comprising two or more biased targets and the method comprises:

determining at least one of the regions of higher amplitude as a region associated with overlay relating to the combination target and an associated value in the real space;

determining a respective position value in the real space for each bias value based on the region associated with overlay; and determining an overlay value from the respective position values.

30. A method of metrology according to clause 29, wherein the combination target is subject to a grating imbalance such that there is a respective different the region associated with overlay and respective associated value in the real space for at least two of the two or more biased targets; and the method comprises determining each respective position value from its respective associated value.

31. A method of metrology according to any of clauses 20 to 30, comprising determining a calibration to calibrate the reconstruction signal; the calibration comprising:

creating a plurality of targets with a process parameter varied, such that critical dimension also varies per target;

determining reconstruction signals per target and corresponding cross-correlation functions; identify a target for which a region of the reconstruction signal associated with critical dimension is zero or close to zero for a complementary pair of even-numbered diffraction orders;

determine a threshold value such that a part of the cross-correlation function corresponding to the target and the region of the reconstruction signal which is above the threshold has a width equal to half of the target pitch; and using the threshold to assign critical dimension values to one or more of the other cross-correlation functions.

32. A method of metrology according to any of clauses 20 to 31, comprising:

identifying at least one of the regions of higher amplitude in real space as a region associated with a critical dimension of one or more structures; and determining the critical dimension from a ratio of a first value of the reconstruction signal corresponding to the region associated with critical dimension corresponding to a first higher diffraction order and a second value of the reconstruction signal corresponding to the region associated with critical dimension corresponding to a second higher diffraction order of different diffraction order number.

33. A method of metrology according to any of clauses 16 to 32, wherein the step of further transforming is performed on an optimized region in the reciprocal space; wherein the optimized region is optimized for one or more of:

no missing data in the optimized region;

a contiguous range of diffraction orders is covered by the optimized region for each value in the reciprocal space; and only combinations that can be extracted unambiguously are covered.

34. A method of metrology according to any of clauses 16 to 33, comprising constructing a full reconstruction of the one or more structures in one, two, or three dimensions from the reconstruction signal.

35. A method of metrology according to any of clauses 16 to 34, comprising applying a correction for the actual refractive index of the one or more structures and/or associated layers.

36. A method of metrology according to any of clauses 16 to 35, wherein the reconstruction signal comprises a combination of results from multiple measurements using different illumination spectra on the same one or more structures.

37. A method of metrology according to any of clauses 16 to 36, wherein the measurement data relates to at least three diffraction orders.

38. A method of metrology according to any of clauses 16 to 37, wherein the measurement data relates to at least a pair of complementary higher orders and a zero order; or two pairs of complementary higher orders.

39. A method of metrology according to any of clauses 16 to 36, wherein the measurement data relates to only a pair of complementary higher orders, and the method comprises:

determining a complex-valued pair of the reconstruction signal in terms of a first direction perpendicular to the substrate plane, each relating to a respective one of the pair of complementary higher orders; and estimating a position of the one or more structures in a second or third direction parallel to a substrate plane from the complex valued pair.

40. A method of metrology according to clause 39, wherein the estimating step is based on extracting a phase difference between a first reconstruction signal of the complex valued pair and a second reconstruction signal of the complex valued pair.

41. A method of metrology according to any of clauses 16 to 40, comprising applying a phase-gradient correction to the reconstruction signal.

42. A method of metrology according to any of clauses 16 to 41, comprising splitting the measurement data into symmetric and asymmetric components and treating each separately.

43. A method of metrology according to any of clauses 16 to 42, comprising using the reconstruction signal represented in real space; and/or features thereof as an input for a model and training the model on reference data, such that the trained model is able to correct for any assumptions used in generating the reconstruction signal.

44. A method of metrology according to clause 43, comprising using the trained model to correct for any assumptions used in generating the reconstruction signal.

45. A method of metrology according to any preceding clause, wherein the measurement data comprises diffraction efficiencies or diffraction intensities or relates to any amplitude metric for a plurality of diffraction orders.

46. A method of metrology comprising:

obtaining, using a plurality of measurement settings, first measurement data relating to measurement of a first structure on a substrate and second measurement data relating to measurement of a second structure on the substrate the first structure and second structure having a difference in an imposed bias between them;

determining a first relationship between the first measurement data and the measurement setting and a second relationship between the second measurement data and the measurement setting;

correcting the first measurement data and/or second measurement data to amend the first relationship with respect to the second relationship such that they have a common measurement setting for a particular measurement value; and inferring a structure parameter value based on the corrected first measurement data and/or second measurement data.

47. A method of inferring a value for a parameter of interest from the measurement data, comprising:

obtaining the measurement data, the measurement data relating to scattered radiation from a target captured on a detector;

obtaining a trained forward model describing a measured signal in terms of at least one parameter of interest term describing the response to the parameter of interest of a target, one or more nuisance terms describing other variations between measurements of the target and a constant term representing a constant component of the measurement data; and inferring the value for the parameter of interest from the measurement data using the trained forward model.

48. A computer program comprising computer readable instruction operable to perform at least steps of the method of any of clauses 1 to 47 including:

the transforming the measurement data to frequency domain, and extracting the feature of the substrate or eliminating the impact of the nuisance parameter.

49. A metrology device operable to perform the method of any of clauses 1 to 47.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference is made to SXR and EUV electromagnetic radiations, it will be appreciated that the invention, where the context allows, may be practiced with all electromagnetic radiations, includes radio waves, micro-waves, infrared, (visible) light, ultraviolet, X-rays, and gamma rays. As an alternative to optical metrology methods, it has also been considered to use X-rays, optionally hard X-rays, for example radiation in a wavelength range between 0.01 nm and 10 nm, or optionally between 0.01 nm and 0.2 nm, or optionally between 0.1 nm and 0.2 nm, for metrology measurements.

The invention claimed is:

1. A method of metrology comprising:
    illuminating radiation onto a substrate, the radiation having a wavelength that is greater than or equal to 0.1 nm and less than or equal to 100 nm;
    obtaining measurement data relating to at least one measurement of each of one or more structures on the substrate;
    using a Fourier-related transform to transform the measurement data into a transformed measurement data, the transformed measurement data comprising a depth spectrum; and
    extracting a feature of the substrate from the transformed measurement data or eliminating an impact of a nuisance parameter.

2. The method of claim 1, wherein the extracting a feature of the substrate from the transformed measurement data or eliminating an impact of a nuisance parameter comprises:
    determining a reconstruction signal from the transformed measurement data; and
    determining one or more positional and/or size parameters of the one or more structures from the reconstruction signal.

3. The method of claim 2, wherein:
    the reconstruction signal comprises regions of higher amplitude; and
    the determining one or more positional and/or size parameters comprises determining these parameters from the size and/or position and/or a configuration of a corresponding one or more of the regions of higher amplitude.

4. The method of claim 3, wherein the size and/or position and/or a configuration of the regions of higher amplitude corresponding to a second and/or third direction parallel to a substrate plane is indicative of the one or more of the positional and/or size parameters in the second and/or third direction.

5. The method of claim 2, wherein the reconstruction signal comprises a combination of results from multiple measurements using different illumination spectra on the same one or more structures.

6. The method of claim 1, wherein the extracting a feature of the substrate from the transformed measurement data or eliminating an impact of a nuisance parameter comprises determining a position of a peak value in the transformed measurement data and extracting a feature of the substrate from the position of the peak value.

7. The method of claim 1, wherein the using a Fourier-related transform to transform the measurement data into transformed measurement data comprises transforming the measurement data from a reciprocal space to a real space.

8. The method of claim 7, wherein the transforming the measurement data into transformed measurement data comprises a Fourier transform.

9. The method of claim 7, further comprising transforming the transformed measurement data back to the reciprocal space.

10. The method of claim 1, wherein the extracting a feature of the substrate from the transformed measurement data or eliminating an impact of a nuisance parameter comprises applying a bandpass filter to the transformed measurement data.

11. The method of claim 1, further comprising a weighting step using a weighting function.

12. The method of claim 1, wherein the obtaining the measurement data relating to at least one measurement of each of one or more structures on the substrate comprises obtaining a diffraction pattern from a target structure comprising at least two differently biased targets.

13. The method of claim 1, wherein the method is an iterative method.

14. The method of claim 1, wherein the method is a non-iterative method.

15. The method of claim 1, wherein the method comprises a data-driven step or training a model.

16. The method of claim 1, wherein the measurement data comprises at least an asymmetry or symmetry component of the measurement data describing an asymmetry in the one or more structures.

17. The method of claim 1, wherein the measurement data comprises diffraction efficiencies or diffraction intensities or relates to any amplitude metric for a plurality of diffraction orders.

18. The method of claim 1, wherein the Fourier-related transform is performed to obtain a complex-valued spectrum for the one or more structures in distance space.

19. The method of claim 1, further comprising performing the transforming the measurement data to cover three dimensions of the one or more structures.

20. The method of claim 1, wherein the obtaining measurement data comprises obtaining the measurement data in pupil space.

21. A non-transitory computer program product comprising machine-readable instructions therein, the instructions, upon execution by a computer system, configured to cause the computer system to at least cause performance of a method of metrology comprising:

illuminating radiation onto a substrate, the radiation having a wavelength that is greater than or equal to 0.1 nm and less than or equal to 100 nm;

obtaining measurement data relating to at least one measurement of each of one or more structures on the substrate;

using a Fourier-related transform to transform the measurement data into a transformed measurement data, the transformed measurement data comprising a depth spectrum; and extracting a feature of the substrate from the transformed measurement data or eliminating an impact of a nuisance parameter.

22. A metrology apparatus comprising:

a controller configured to:

illuminate radiation onto a substrate, the radiation having a wavelength that is greater than or equal to 0.1 nm and less than or equal to 100 nm;

obtain a measurement data relating to at least one measurement of each of one or more structures on the substrate;

use a Fourier-related transform to transform the measurement data into a transformed measurement data, the transformed measurement data comprising a depth spectrum; and extract a feature of the substrate from the transformed measurement data or eliminating an impact of a nuisance parameter.

\* \* \* \* \*